United States Patent
Shibuya

(10) Patent No.: US 11,322,204 B2
(45) Date of Patent: May 3, 2022

(54) SEMICONDUCTOR MEMORY DEVICE

(71) Applicant: KIOXIA CORPORATION, Tokyo (JP)

(72) Inventor: Taira Shibuya, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 256 days.

(21) Appl. No.: 16/557,898

(22) Filed: Aug. 30, 2019

(65) Prior Publication Data

US 2020/0294600 A1  Sep. 17, 2020

(30) Foreign Application Priority Data

Mar. 12, 2019 (JP) .............................. JP2019-045140

(51) Int. Cl.
| | |
|---|---|
| *G11C 16/04* | (2006.01) |
| *G11C 16/10* | (2006.01) |
| *G11C 16/24* | (2006.01) |
| *G11C 16/26* | (2006.01) |
| *G11C 16/34* | (2006.01) |

(52) U.S. Cl.
CPC .......... *G11C 16/10* (2013.01); *G11C 16/0466* (2013.01); *G11C 16/24* (2013.01); *G11C 16/26* (2013.01); *G11C 16/3436* (2013.01); *G11C 16/0483* (2013.01)

(58) Field of Classification Search
CPC ..... G11C 16/10; G11C 16/0466; G11C 16/24; G11C 16/26; G11C 16/3436
USPC ......................................................... 711/154
See application file for complete search history.

(56) References Cited

U.S. PATENT DOCUMENTS

| | | | | |
|---|---|---|---|---|
| 9,449,708 B2* | 9/2016 | Hirai | .................. | G11C 16/3427 |
| 10,109,359 B2* | 10/2018 | Iwai | .................... | G11C 16/3459 |
| 2006/0018152 A1* | 1/2006 | Kawai | .................. | G11C 11/5628 365/185.03 |
| 2007/0002632 A1* | 1/2007 | Okayama | ........... | G11C 16/3418 365/185.24 |
| 2009/0073771 A1 | 3/2009 | Li | | |
| 2012/0113722 A1* | 5/2012 | Aritome | ............. | G11C 16/0483 365/185.18 |
| 2013/0235662 A1 | 9/2013 | Fujiu | | |

(Continued)

FOREIGN PATENT DOCUMENTS

| | | |
|---|---|---|
| JP | 2013-186932 A | 9/2013 |
| TW | I501247 B | 9/2015 |
| TW | I552317 B | 10/2016 |

*Primary Examiner* — Ly D Pham
(74) *Attorney, Agent, or Firm* — Kim & Stewart LLP

(57) ABSTRACT

A semiconductor memory device includes first and second memory cells, adjacent first and second word line connected to gates of the first and second memory cells, respectively, a word line driver for the first and second word lines, a bit line connected to the first and second memory cells, a sense amplifier circuit configured to detect data stored in the memory cells via the bit line and apply a voltage to the bit line, and a control circuit configured to control the word line driver and the sense amplifier circuit to execute a write operation. During a write operation performed on the first memory cell to increase a threshold voltage of the first memory cell to a target state, the control circuit changes the bit line voltage of the bit line according to a difference between the target state and a threshold voltage state of the second memory cell.

12 Claims, 16 Drawing Sheets

(56) References Cited

U.S. PATENT DOCUMENTS

| | | | |
|---|---|---|---|
| 2013/0315003 A1* | 11/2013 | Lee | G11C 16/24 |
| | | | 365/185.22 |
| 2016/0071601 A1 | 3/2016 | Shirakawa et al. | |
| 2018/0276072 A1* | 9/2018 | Kodama | G06F 11/1068 |
| 2019/0088312 A1* | 3/2019 | Shiino | G11C 11/5642 |

* cited by examiner

*FIG. 25*

|  |  | SU0 | SU1 | SU2 | SU3 |
|---|---|---|---|---|---|
| WL7 | FINE WRITE | ... | ... | ... | ... |
|  | FOGGY WRITE | ... | ... | ... | ... |
| ⋮ | ⋮ | ⋮ | ⋮ | ⋮ | ⋮ |
| WL2 | FINE WRITE | ... | ... | ... | ... |
|  | FOGGY WRITE | 13 | 14 | 15 | 16 |
| WL1 | FINE WRITE | 17 | 18 | 19 | 20 |
|  | FOGGY WRITE | 5 | 6 | 7 | 8 |
| WL0 | FINE WRITE | 9 | 10 | 11 | 12 |
|  | FOGGY WRITE | 1 | 2 | 3 | 4 |

SEMICONDUCTOR MEMORY DEVICE

CROSS-REFERENCE TO RELATED APPLICATION

This application is based upon and claims the benefit of priority from Japanese Patent Application No. 2019-045140, filed Mar. 12, 2019, the entire contents of which are incorporated herein by reference.

FIELD

Embodiments described herein relate generally to a semiconductor memory device.

BACKGROUND

In a NAND type FLASH memory, a memory cell may be programmed not only as an SLC (Single Level Cell), in which 1-bit (binary) data is stored, but also as an MLC (Multi-Level Cell), in which 2-bit (4-level) data is stored, a TLC (Triple-Level Cell), in which 3-bit (8-level) data is stored, or a QLC (Quad-Level Cell), in which 4-bit (16-level) data is stored.

When data is written into a memory cell, the threshold voltage of the memory cell changes according to the amount of charges stored in a charge storage film. After the memory cell is set to a high threshold voltage as a result of the data write, the threshold voltage may decrease over time. In addition, after the memory cell is set to a low threshold voltage as a result of the data write, the threshold voltage may increase over time.

DESCRIPTION OF THE DRAWINGS

FIG. 25 illustrates an order of executing a first write operation and a second write operation according to the second embodiment.

DETAILED DESCRIPTION

Embodiments provide a semiconductor memory device capable of reducing the influence of data retention time on changes in a threshold voltage of a memory cell.

In general, according to one embodiment, there is provided a semiconductor memory device including a memory cell array including a plurality of memory cells, the plurality of memory cells including first and second memory cells, a plurality of word lines connected to the gates of the plurality of memory cells, respectively, the plurality of word lines including adjacent first and second word lines, wherein the first word line is connected to the gate of the first memory cell and the second word line is connected to the gate of the second memory cell, a word line driver configured to apply a voltage to each of the plurality of word lines, a plurality of bit lines connected to the plurality of memory cells, the plurality of bit lines including a first bit line connected to the first and second memory cells, a sense amplifier circuit configured to detect data stored in the plurality of memory cells via the plurality of bit lines and apply a bit line voltage to the plurality of bit lines, and a control circuit configured to control the word line driver and the sense amplifier circuit to execute a write operation. During a write operation performed on the first memory cell to increase a threshold voltage of the first memory cell to a target state, the control circuit changes the bit line voltage of the first bit line according to a difference between the target state and a threshold voltage state of the second memory cell.

Hereinafter, embodiments will be described with reference to the drawings.

First Embodiment (Configuration of Memory System)

Figure 1:
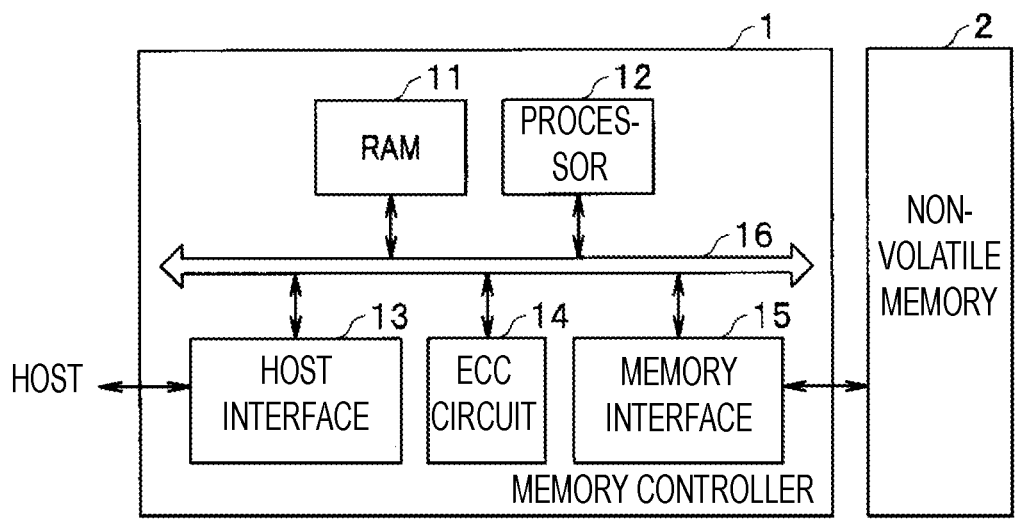
FIG. 1 is a block diagram of a memory system including a semiconductor memory device according to a first embodiment.

FIG. 1 is a block diagram of a memory system including a semiconductor memory device according to an embodiment. The memory system of the present embodiment includes a memory controller 1 and a semiconductor memory device that stores data in a nonvolatile manner (referred to herein as a nonvolatile memory 2). The memory system may be connected to a host. The host is, for example, an electronic apparatus such as a personal computer or a portable terminal.

The nonvolatile memory 2 includes, for example, a NAND flash memory. In the present embodiment, the nonvolatile memory 2 is a NAND flash memory having memory cells, in which 3 bits are stored per memory cell, that is, a NAND memory storing 3 bits/cell (TLC: Triple-Level Cell). The nonvolatile memory 2 has a three-dimensional structure.

The memory controller 1 controls writing of data into the nonvolatile memory 2 according to a write request from the host. The memory controller 1 also controls reading of data from the nonvolatile memory 2 according to a read request from the host. The memory controller 1 includes a random access memory (RAM) 11, a processor 12, a host interface 13, an error checking and correction (ECC) circuit 14, and a memory interface 15. The RAM 11, the processor 12, the host interface 13, the ECC circuit 14, and the memory interface 15 are interconnected by an internal bus 16.

The host interface 13 outputs a request received from the host, write data (e.g., user data), and the like to the internal bus 16. Further, the host interface 13 transmits user data read from the nonvolatile memory 2, a response from the processor 12, and the like to the host.

Based on instructions from the processor 12, the memory interface 15 controls a process of writing user data and the like into the nonvolatile memory 2 and a process of reading user data and the like from the nonvolatile memory 2.

The processor 12 controls the memory controller 1. The processor 12 is, for example, a CPU (Central Processing Unit), an MPU (Micro Processing Unit) or the like. When a request is received from the host via the host interface 13, the processor 12 performs control in accordance with the request. For example, the processor 12 instructs the memory interface 15 to write user data and parity into the nonvolatile memory 2 according to a request from the host. The processor 12 also instructs the memory interface 15 to read user data and parity from the nonvolatile memory 2 according to a request from the host.

The processor 12 determines a storage area (hereinafter, referred to as a memory area) in the nonvolatile memory 2 for user data stored in the RAM 11. The user data is stored in the RAM 11 via the internal bus 16. The processor 12 determines the memory area for the user data in units of page, which is a unit of writing. In the descriptions provided herein, the user data stored in one page of the nonvolatile memory 2 is defined as unit data, and the unit data is encoded and stored as a code word in the nonvolatile memory 2.

Alternatively, the encoding may not be necessarily performed. Accordingly, the memory controller 1 may store the unit data in the nonvolatile memory 2 without performing the encoding. However, FIG. 1 illustrates a configuration in which the encoding is performed, as an example. When the memory controller 1 does not perform the encoding, the page data matches the unit data. In addition, one code word may be generated from one unit data, or one code word may be generated from division data, which is a divided part of the unit data. Further, one code word may be generated from a plurality of unit data.

The processor 12 determines the memory area of the nonvolatile memory 2 corresponding to a write destination for each unit data. A physical address is assigned to the memory area of the nonvolatile memory 2. The processor 12 uses the physical address to manage the memory area corresponding to the write destination of the unit data. The processor 12 designates the physical address corresponding to the determined memory area when instructing the memory interface 15 to write the user data into the nonvolatile memory 2. The processor 12 manages the correspondence between a logical address of the user data (which is the logical address managed by the host) and the physical address. When a read request including a logical address is received from the host, the processor 12 specifies a physical address corresponding to the logical address, and designates the physical address when instructing the memory interface 15 to read the user data.

The ECC circuit 14 encodes the user data stored in the RAM 11 to generate a code word. In addition, the ECC circuit 14 decodes the code word read from the nonvolatile memory 2.

The RAM 11 temporarily stores the user data received from the host before storing the user data in the nonvolatile memory 2, or temporarily stores the data read from the nonvolatile memory 2 before transmitting the data to the host. The RAM 11 is, for example, a general-purpose memory such as a SRAM (Static Random Access Memory) or a DRAM (Dynamic Random Access Memory).

FIG. 1 illustrates an example of a configuration in which the ECC circuit 14 and the memory interface 15 are separate components. However, the ECC circuit 14 may be incorporated in the memory interface 15. Further, the ECC circuit 14 may be incorporated in the nonvolatile memory 2.

When a write request is received from the host, the memory controller 1 operates as follows. The processor 12 temporarily stores the write data in the RAM 11. The processor 12 reads the data stored in the RAM 11 and inputs the data to the ECC circuit 14. The ECC circuit 14 encodes the input data and inputs the code word to the memory interface 15. The memory interface 15 writes the input code word into the nonvolatile memory 2.

When a read request is received from the host, the memory controller 1 operates as follows. The memory interface 15 inputs the code word read from the nonvolatile memory 2 to the ECC circuit 14. The ECC circuit 14 decodes the input code word and stores the decoded data in the RAM 11. The processor 12 transmits the data stored in the RAM 11 to the host via the host interface 13.

Figure 2:
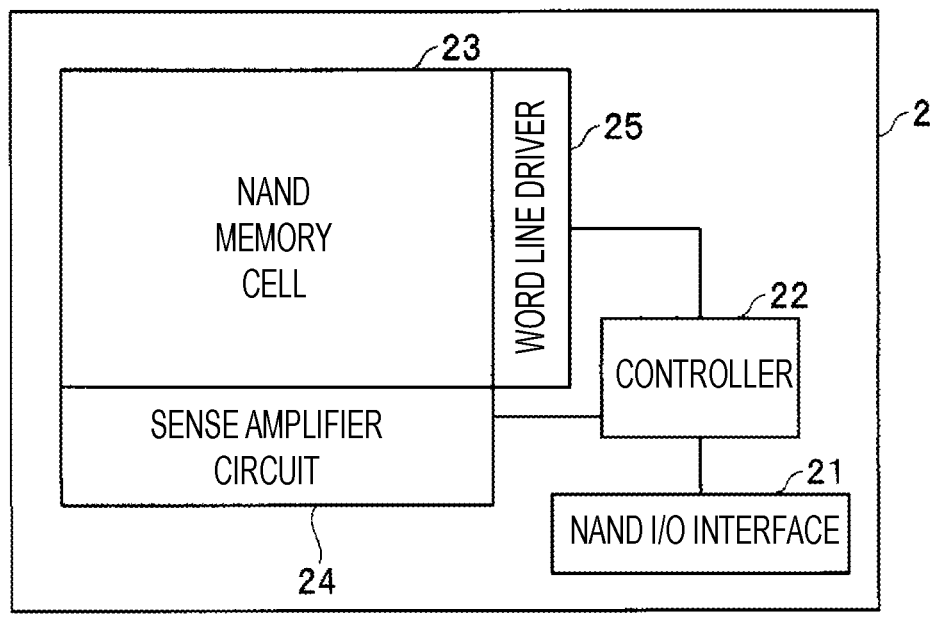
FIG. 2 is a block diagram of the semiconductor memory device according to the first embodiment.

FIG. 2 is a block diagram of the nonvolatile memory 2. The nonvolatile memory 2 includes a NAND I/O interface 21, a controller 22, a NAND memory cell array 23, a sense amplifier circuit 24, and a word line driver 25. The nonvolatile memory 2 is formed on a semiconductor substrate (e.g., a silicon substrate) as a single chip.

The NAND I/O interface 21 receives control signals such as a write enable signal WEn, a read enable signal REn, an address latch enable signal ALE, a command latch enable signal CLE and the like output from the memory controller 1. The NAND I/O interface 21 also receives commands, addresses, and data output from the memory controller 1.

The controller (which is a control circuit) 22 receives the control signals, commands, addresses, and data from the NAND I/O interface 21, and controls the operation of the nonvolatile memory 2 based on the control signals, commands, addresses, and data. For example, based on the control signals, commands, addresses, and data, the controller 22 controls the word line driver 25 and the sense amplifier circuit 24 to execute a write operation, a read operation, an erase operation and the like.

When a write command is input, the controller 22 controls the sense amplifier circuit 24 and the word line driver 25 to write data input along with the write command at a designated address of the NAND memory cell array 23. Further, when a read command is input, the controller 22 controls the sense amplifier circuit 24 and the word line driver 25 to read data from a designated address of the NAND memory cell array 23.

For example, in order to write data into a memory cell (more particularly, a memory cell transistor) MT in the NAND memory cell array 23, the controller 22 controls a voltage applied to a plurality of word lines WL by the word line driver 25 or a bit line voltage applied to a plurality of bit lines BL by the sense amplifier circuit 24.

The sense amplifier circuit 24 is configured to apply voltages (or currents) independently to a plurality of bit lines BL and to detect voltages (or currents) of a plurality of bit lines BL independently so as to detect each memory cell MT data. That is, the sense amplifier circuit 24 can detect data of a plurality of memory cells MT via the plurality of bit lines BL.

The word line driver 25 is configured to independently apply various voltages such as a program voltage and the like to the plurality of word lines and select gate lines. That is, the word line driver 25 is able to apply a program voltage to the plurality of word lines.

(Configuration of NAND Memory Cell Array)

Figure 3:
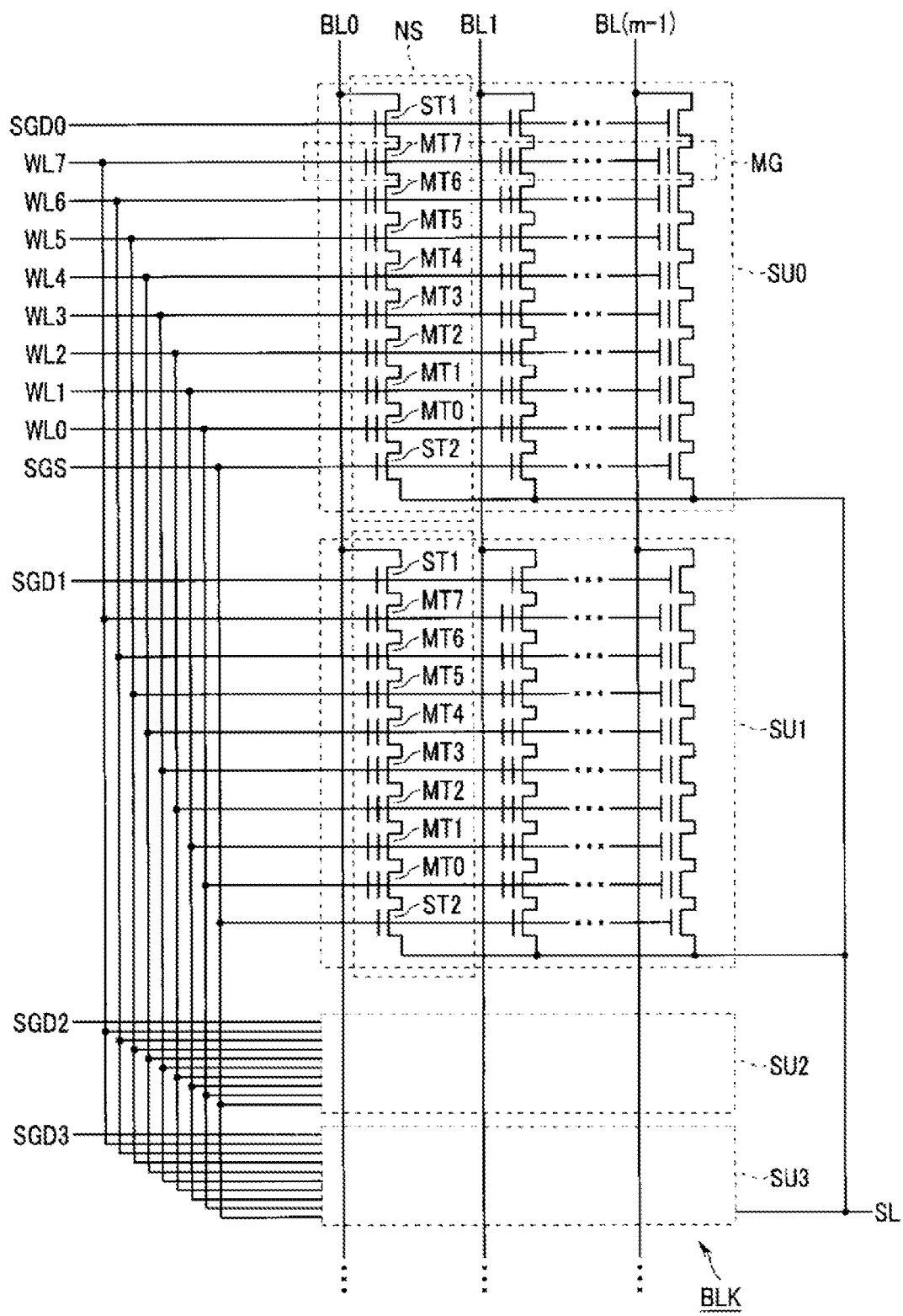
FIG. 3 is a circuit diagram of a memory cell array in the semiconductor memory device according to the first embodiment.

FIG. 3 is a circuit diagram of one block of the three-dimensional NAND memory cell array 23. FIG. 3 illustrates one block BLK among a plurality of blocks that make up the three-dimensional NAND memory cell array (hereinafter, referred to as a memory cell array) 23. The other blocks of the memory cell array also have the same configuration as that illustrated in FIG. 3. The memory cell array 23 includes a plurality of memory cells MT, each of which can be set to any of plural threshold voltage states (or more simply referred to as states), as will be described later.

As illustrated, the block BLK includes, for example, four string units (SU0 to SU3). In addition, each string unit SU includes a plurality of NAND strings NS. Each NAND string NS includes eight memory cells MT (MT0 to MT7) and select transistors ST1 and ST2. The number of memory cells MT in the NAND string NS is eight in this example, but the number of memory cells MT in the NAND string NS is not limited to eight and may be, for example, 32, 48, 64 or 96. Although illustrated differently, each of the select transistors ST1 and ST2 may have the same structure as the memory cell transistor. Further, for example, in order to improve the cutoff characteristic of the select transistors, a plurality of select transistors may be used in place of a single select transistor ST1 and in place of a single select transistor ST2. Furthermore, dummy cell transistors may be provided between the memory cells MT and the select transistors ST1 and ST2.

The memory cells MT are arranged to be connected in series between the select transistors ST1 and ST2. The memory cell MT7 at one end is connected to the select transistor ST1, and the memory cell MT0 at the other end is connected to the select transistor ST2.

The gates of the select transistors ST1 of the respective string units SU0 to SU3 are connected to select gate lines SGD0 to SGD3, respectively. Meanwhile, the gates of the select transistors ST2 are connected in common to the same select gate line SGS across a plurality of string units SU in the same block BLK. In addition, the gates of the memory cells MT0 to MT7 in the same block BLK are connected in common to word lines WL0 to WL7, respectively. While the word lines WL0 to WL7 and the select gate line SGS are connected in common among the plurality of string units SU0 to SU3 in the same block BLK, the select gate lines SGD are independent for each of the string units SU0 to SU3 in the same block BLK.

The word lines WL0 to WL7 are connected to the gates of the memory cells MT0 to MT7, respectively, that make the NAND string NS. That is, the plurality of word lines WL are connected to the gates of the plurality of memory cells MT. The gates of the memory cells MTi in the same row in the block BLK are connected to the same word line WLi. In addition, in the following description, the NAND string NS may be simply referred to as a "string."

Each NAND string NS is connected to a corresponding bit line. Therefore, each memory cell MT is connected to a bit line via the select transistors ST in the NAND string NS and the other memory cells MT. The plurality of bit lines BL are connected to one end of the plurality of NAND strings NS.

As described above, the data of the memory cells MT in the same block BLK are collectively erased. Meanwhile, reading and writing of data are performed in units of a memory cell group MG. In the descriptions herein, a plurality of memory cells MT which are connected to one word line WLi and belong to one string unit SU are defined as the memory cell group MG. In the present embodiment, the nonvolatile memory 2 is a TLC (Triple-Level Cell) NAND memory, in which 3-bit (8-level) data is stored per memory cell. Therefore, one memory cell group MG is programmed to store data corresponding to three pages. The three bits stored by each memory cell MT correspond to the three pages, respectively.

Figure 4:
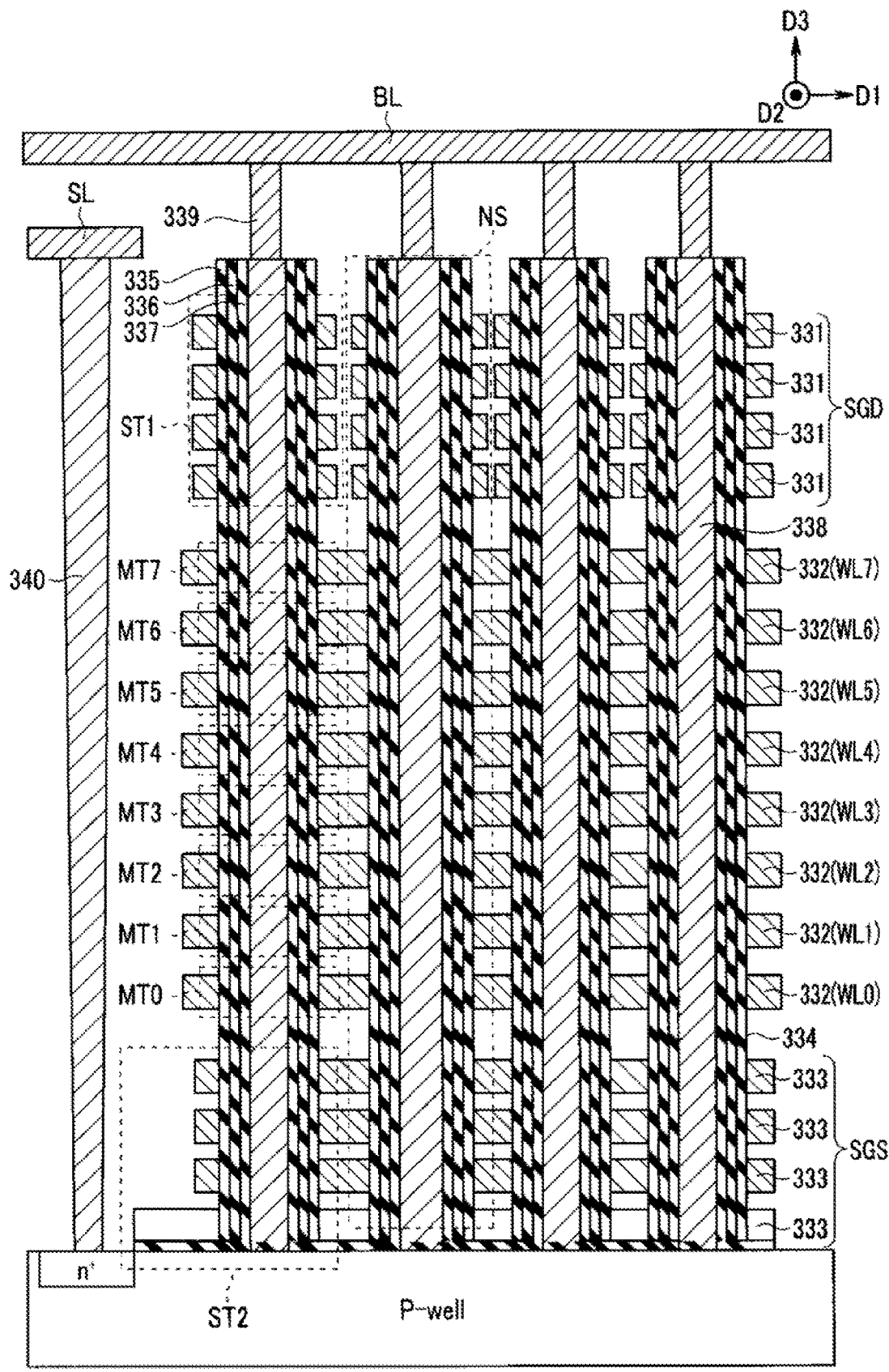
FIG. 4 is a cross-section of a part of the memory cell array in the semiconductor memory device according to the first embodiment.

FIG. 4 is a sectional view of a partial region of the three-dimensional NAND memory cell array. As illustrated in FIG. 4, a plurality of NAND strings NS are formed on a p type well region (P-well). That is, on the p type well region are stacked a plurality of wiring layers 333 that function as select gate lines SGS, a plurality of wiring layers 332 that function as word line lines WLi, and a plurality of wiring layers 331 that function as select gate lines SGD.

Then, a memory hole 334 is formed to penetrate the wiring layers 333, 332, and 331 and reach the p type well region. A block insulating film 335, a charge storage film (charge storing region) 336, and a gate insulating film 337 are formed in this order on the side surface of the memory hole 334, and a semiconductor post 338 is embedded in the memory hole 334. The semiconductor post 338 is made of, for example, polysilicon, and functions as a region in which a channel is formed when the memory cells MT and the select transistors ST1 and ST2 in the NAND string NS are operated. That is, the wiring layers 331, the semiconductor post 338, and the films 335 to 337 between the wiring layers 331 and the semiconductor post 338 function as the select transistor ST1. In addition, the wiring layers 332, the semiconductor post 338, and the films 335 to 337 between the wiring layers 332 and the semiconductor post 338 function as the memory cells MT, and the wiring layers 333, the semiconductor post 338, and the films 335 to 337 between the wiring layers 333 and the semiconductor post 338 function as the select transistor ST2.

In each NAND string NS, the select transistor ST2, the plurality of memory cells MT, and the select transistor ST1 are formed in this order on the p type well region. A wiring layer that functions as a bit line BL is formed above the semiconductor post 338. A contact plug 339 is formed on the upper end of the semiconductor post 338 to connect the semiconductor post 338 and the bit line BL to each other.

Further, an n+ type impurity diffusion layer and a p+ type impurity diffusion layer are formed in the surface of the p type well region. A contact plug 340 is formed on the n+ type impurity diffusion layer, and a wiring layer that functions as a source line SL is formed on the contact plug 340.

A plurality of configurations illustrated in FIG. 4 described above are arranged in the depth direction of the paper surface of FIG. 4, and one string unit SU is formed by a set of plural NAND strings lined up in the depth direction.

(Threshold Voltage Distribution of Memory Cell Transistor)

Figure 5:
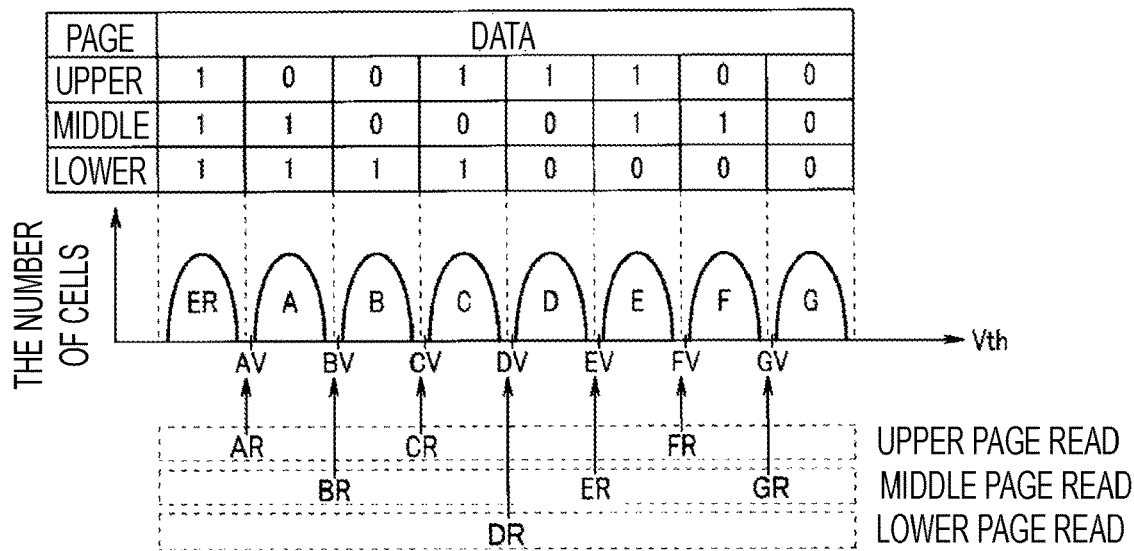
FIG. 5 illustrates a relationship between threshold voltage distributions and data values represented by the different threshold voltage distributions.

FIG. 5 illustrates a relationship between threshold voltage distributions and data values represented by the different threshold voltage distributions. FIG. 5 illustrates an example of threshold voltage distributions for the 3 bit/cell nonvolatile memory 2. 3-bit data is stored per memory cell in the nonvolatile memory 2 according to the amount of charges stored in the charge storage film 336 of the memory cell MT. Each memory cell MT has a threshold voltage state corresponding to the amount of charges. The plurality of data values representing the amount of charges stored in the memory cell MT correspond to a plurality of threshold voltage states, respectively.

Eight threshold voltage distributions (also referred to as lobes) are represented by Er, A, B, C, D, E, F, and G in FIG. 5 and correspond to eight threshold voltage states. The eight threshold voltage distributions are partitioned by seven boundaries. In FIG. 5, the horizontal axis indicates a threshold voltage, and the vertical axis indicates the number of memory cells. A verify voltage to be used during a write operation is set between adjacent threshold voltage distributions.

In the present embodiment, a memory cell MT having threshold voltages equal to or lower than a verify voltage AV is in an Er state, higher than the verify voltage AV and equal to or lower than a verify voltage BV in an A state, higher than the verify voltage BV and equal to or lower than a verify voltage CV in a B state, higher than the verify voltage CV and equal to or lower than a verify voltage DV in a C state, higher than the verify voltage DV and equal to or lower than a verify voltage EV in a D state, higher than the verify voltage EV and equal to or lower than a verify voltage FV in an E state, higher than the verify voltage FV and equal to or lower than a verify voltage GV in an F state, and higher than the verify voltage GV in a G state.

Further, threshold voltage distributions corresponding to the states Er, A, B, C, D, E, F, and G are referred to as distributions Er, A, B, C, D, E, F, and G (first to eighth distributions), respectively. The verify voltages AV to GV are threshold voltages which are the boundaries of the respective distributions.

In the nonvolatile memory 2, a plurality of data values are associated with a plurality of threshold voltage states (i.e., threshold voltage distributions) of the memory cell MT, respectively. This association is called a data coding. This data coding is set in advance, and at the time of a data writing (in particular, programming), charges are injected into the memory cell MT so as to fall within a threshold voltage distribution according to the data value to be stored according to the data coding. Then, at the time of reading, a read voltage is applied to the memory cell MT, and data corresponding to the threshold voltage of the memory cell MT, is determined depending on whether the threshold voltage of the memory cell MT is lower or higher than the read voltage.

The read voltages AR, BR, CR, DR, ER, FR, and GR are set to voltages lower than the corresponding verify voltages AV, BV, CV, DV, EV, FV, and GV, respectively, as illustrated in FIG. 5.

FIG. 5 illustrates data coding indicating data values corresponding to the respective distributions. In the present embodiment, eight threshold voltage distributions are associated with eight 3-bit data values, respectively. The relationship between the threshold voltage distributions and the data value of the bits is as follows.

A memory cell of which threshold voltage is in the Er distribution is in a state of storing "111."

A memory cell of which threshold voltage is in the A distribution is in a state of storing "011."

A memory cell of which threshold voltage is in the B distribution is in a state of storing "001."

A memory cell of which threshold voltage is in the C distribution is in a state of storing "101."

A memory cell of which threshold voltage is in the D distribution is in a state of storing "100."

A memory cell of which threshold voltage is in the E distribution is in a state of storing "110."

A memory cell of which threshold voltage is in the F distribution is in a state of storing "010."

A memory cell of which threshold voltage is in the G distribution is in a state of storing "000."

In this manner, the state of 3-bit data of each memory cell MT may be represented for each threshold voltage distribution. In addition, when the memory cell MT is in an unwritten state (in an "erased" state), the threshold voltage of the memory cell MT is in the Er distribution. In the coding used here, data is changed by only one bit between any two adjacent states, such as storing data "111" in the Er state and storing data "011" in the A state. In this manner, the coding illustrated in FIG. 5 is referred to as a gray code in which data is changed by only one bit between any two adjacent states.

FIG. 5 illustrates a case where eight distributions are discrete, and this represents an ideal state immediately after data writing. However, adjacent states may actually overlap with each other. For example, after data writing, the upper end of the distribution Er and the lower end of the distribution A may overlap with each other due to a disturbance or the like. In this case, the data is corrected using, for example, an ECC technique.

(Write Operation)

First, a write operation according to the present embodiment will be briefly described. The write operation generally includes a program operation and a verify operation.

The program operation is an operation of increasing a threshold voltage by injecting electrons into the charge storage film 336 (or maintaining the threshold voltage by inhibiting the injection). Hereinafter, the operation of increasing a threshold voltage will be referred to as a "0 program" or "0 write," and "0" data is given to a bit line BL targeted for the "0" program. Meanwhile, the operation of maintaining a threshold voltage will be referred to as a "1" program, "1" write, or "write inhibition," and "1" data is given to a bit line BL targeted for the "1" program.

The verify operation is an operation of determining whether or not the threshold voltage of a memory cell MT has reached a target state, by reading data after the program operation. The memory cell MT that has reached the target state is then write-inhibited.

By repeating the combination of the program operation and the verify operation described above, the threshold voltage of the memory cell MT is increased to the target state.

Figure 6:
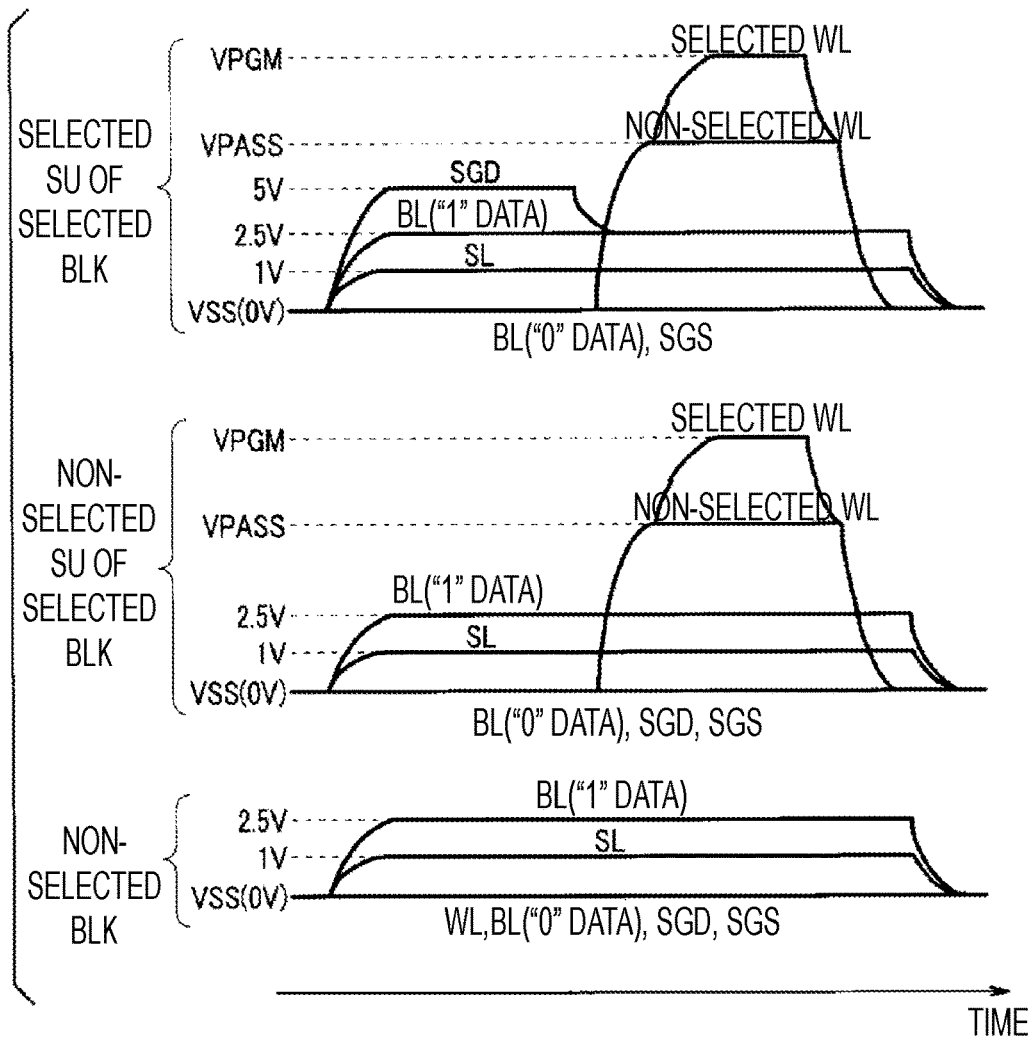
FIG. 6 illustrates voltage changes in various wirings during a program operation according to the first embodiment.

FIG. 6 illustrates voltages changes in various wirings during a program operation. As illustrated, first, the sense amplifier circuit 24 transfers program data to each bit line BL. A ground voltage Vss (e.g., 0 V) is applied as an "L" level to a bit line BL to which "0" data is given. A write inhibition voltage Vinhibit (e.g., 2.5 V) is applied as an "H" level to a bit line BL to which "1" data is given.

The word line driver 25 selects one block BLK and further selects one string unit SU. Then, the word line driver 25 applies, for example, 5 V to a select gate line SGD in the selected string unit SU to turn on the select transistor ST1. Meanwhile, the word line driver 25 turns off the select transistor ST2 by applying the voltage Vss to the select gate line SGS.

Further, the word line driver 25 applies the voltage Vss to the select gate lines SGD and SGS of the non-selected string units SU in the selected block BLK and the non-selected string units SU in the non-selected block BLK, to turn off the select transistors ST1 and ST2.

Further, the source line SL is set to, for example, 1 V (a voltage higher than the voltage of the select gate line SGS).

Thereafter, the word line driver 25 sets the voltage of the select gate line SGD in the selected string unit SU in the selected block BLK to, for example, 2.5 V. This voltage is a voltage to turn on the select transistor ST1 corresponding to the bit line BL to which "0" data (0 V) is given, and to cut off the select transistor ST1 corresponding to bit line BL to which "1" data (2.5V) is given.

Figure 7:
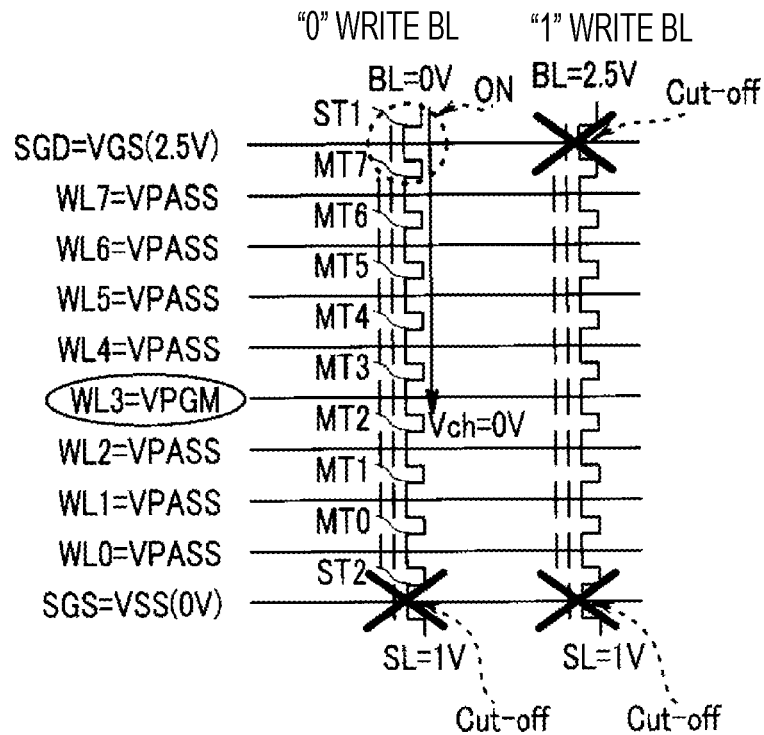
FIG. 7 is a diagram illustrating the state of a string during a program operation according to the first embodiment.

Then, the word line driver 25 selects one word line WL in the selected block BLK, applies a voltage Vpgm to the selected word line, and applies a voltage Vpass_pgm to the other non-selected word lines WL. The voltage Vpgm is a high voltage for injecting electrons into the charge storage film by the tunnel effect, and is higher than Vpass_pgm. FIG. 7 illustrates the state of the string unit SU at this time. FIG. 7 is a diagram illustrating the state of a string during the program operation.

FIG. 7 illustrates two NAND strings that correspond to a bit line BL to be written with "0" and a bit line BL to be written with "1." In addition, FIG. 7 illustrates the state when the word line WL3 is selected.

As illustrated, the voltage Vpgm is applied to the selected word line WL3, and the voltage Vpass_pgm is applied to the non-selected word lines WL0 to WL2 and WL4 to WL7.

Then, in the NAND string that corresponds to the bit line BL to be written with "0," the select transistor ST1 is turned on. Therefore, the channel voltage Vch of the memory cell MT3 connected to the selected word line WL3 becomes 0 V. That is, a voltage difference between the gate and the channel increases. As a result, electrons are injected into the charge storage film so that the threshold voltage of the memory cell MT3 is increased.

In the NAND string that corresponds to the bit line BL to be written with "1," the select transistor ST1 is cut off. Therefore, the channel of the memory cell MT3 connected to the selected word line WL3 becomes electrically floating, and the channel voltage Vch is increased to be close to the voltage Vpgm by capacitive coupling with the word line WL. That is, the voltage difference between the gate and the channel decreases. As a result, electrons are not injected into the charge storage film, and the threshold voltage of the memory cell MT3 is maintained (so that its state does not transition to a higher state).

(QPW Operation)

In place of a normal program operation, a QPW (Quick Pass Write) operation may be performed.

In the normal program operation described above, as illustrated in FIG. 6, an "L" level (e.g., the ground voltage Vss, 0 V) is applied to a bit line BL (given with "0" data) corresponding to a memory cell MT of which threshold value is desired to be increased, and an "H" level (e.g., 2.5 V) is applied to a bit line BL (given with "1" data) corresponding to a memory cell MT of which threshold value is not desired to be increased. In this case, only the two controls of increasing and maintaining the threshold voltage can be performed on the plurality of memory cells MT in the memory cell group MG.

Figure 8:
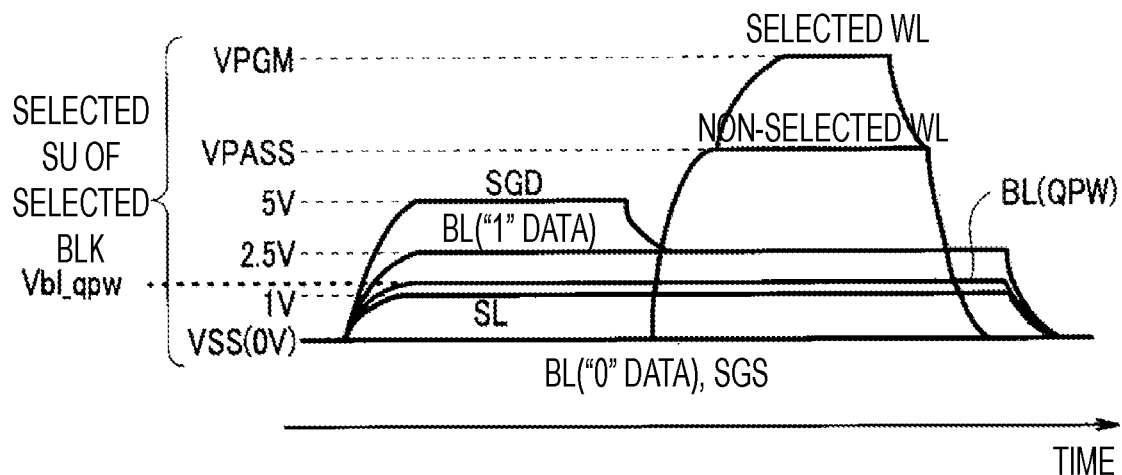
FIG. 8 illustrates voltage changes in various wirings during a QPW operation according to the first embodiment.

FIG. 8 illustrates voltage changes in various wirings during the QPW operation. During the QPW operation, as illustrated in FIG. 8, a voltage higher than the "L" level (the ground voltage Vss, e.g., 0 V) and lower than the "H" level (the write inhibition voltage Vinhibit, e.g., 2.5 V) is applied to a bit line BL corresponding to a memory cell MT of which threshold voltage is desired to be increased by a small amount. That is, the charging level of the bit line BL is raised more than that of the bit line BL (given with "0" data) corresponding to the memory cell MT of which threshold voltage is desired to be increased. Thus, in the target memory cell MT, the channel voltage Vch rises higher than the "L" level (the ground voltage Vss, e.g., 0 V). Therefore, injection of electrons into the charge storage film 336 by the voltage Vpgm applied to the selected word line WL is relaxed by the amount of increase of channel voltage Vch. Therefore, by using the QPW operation, the following three controls may be performed on a plurality of memory cells MT in the memory cell group MG: increasing the threshold voltage, maintaining the threshold voltage, and increasing the threshold voltage by a small amount. Hereinafter, a voltage applied to a bit line BL for the QPW operation will be referred to as a QPW voltage Vbl_qpw.

Figure 9:
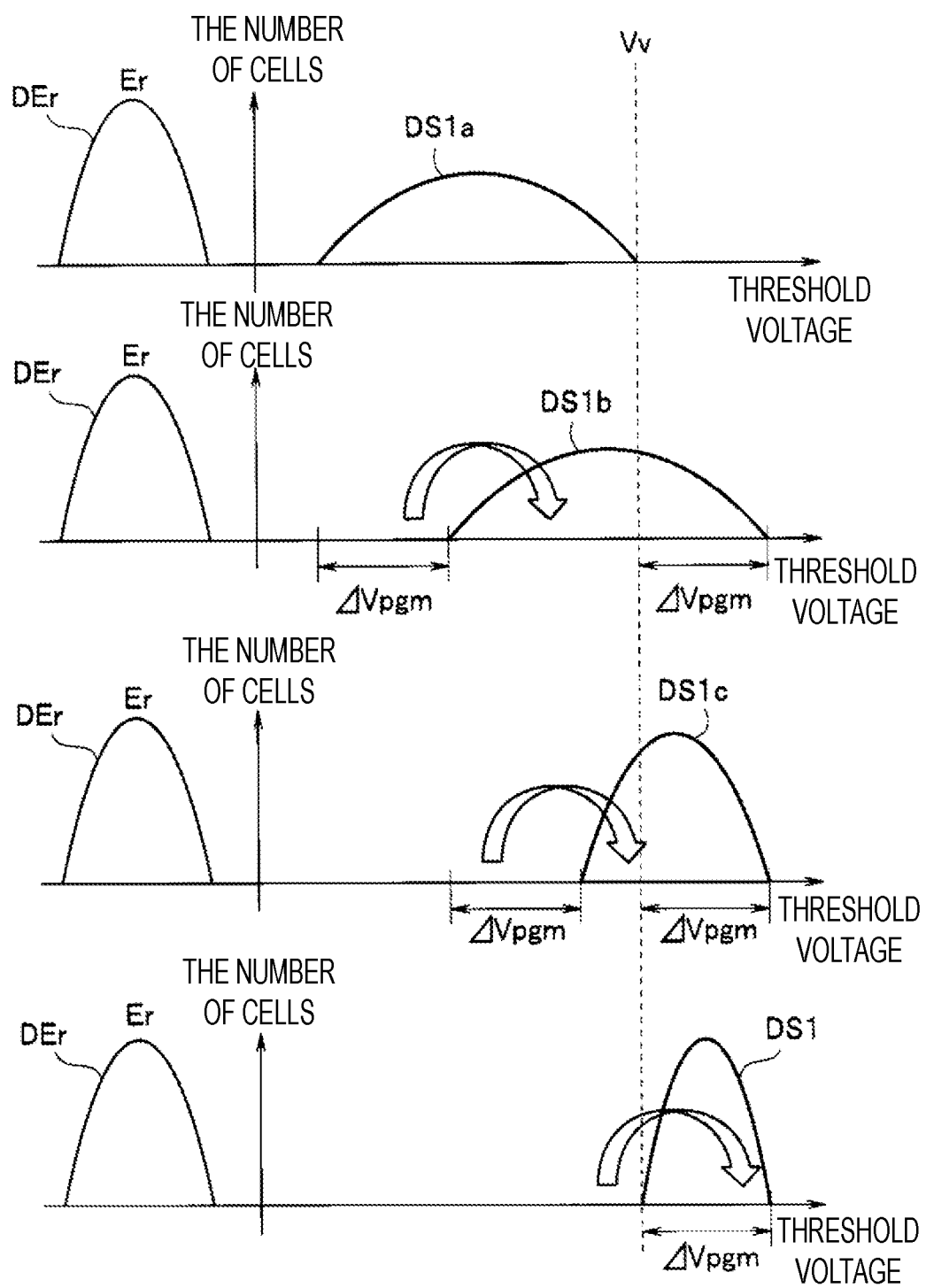
FIG. 9 is a conceptual diagram illustrating a normal program operation.
Figure 10:
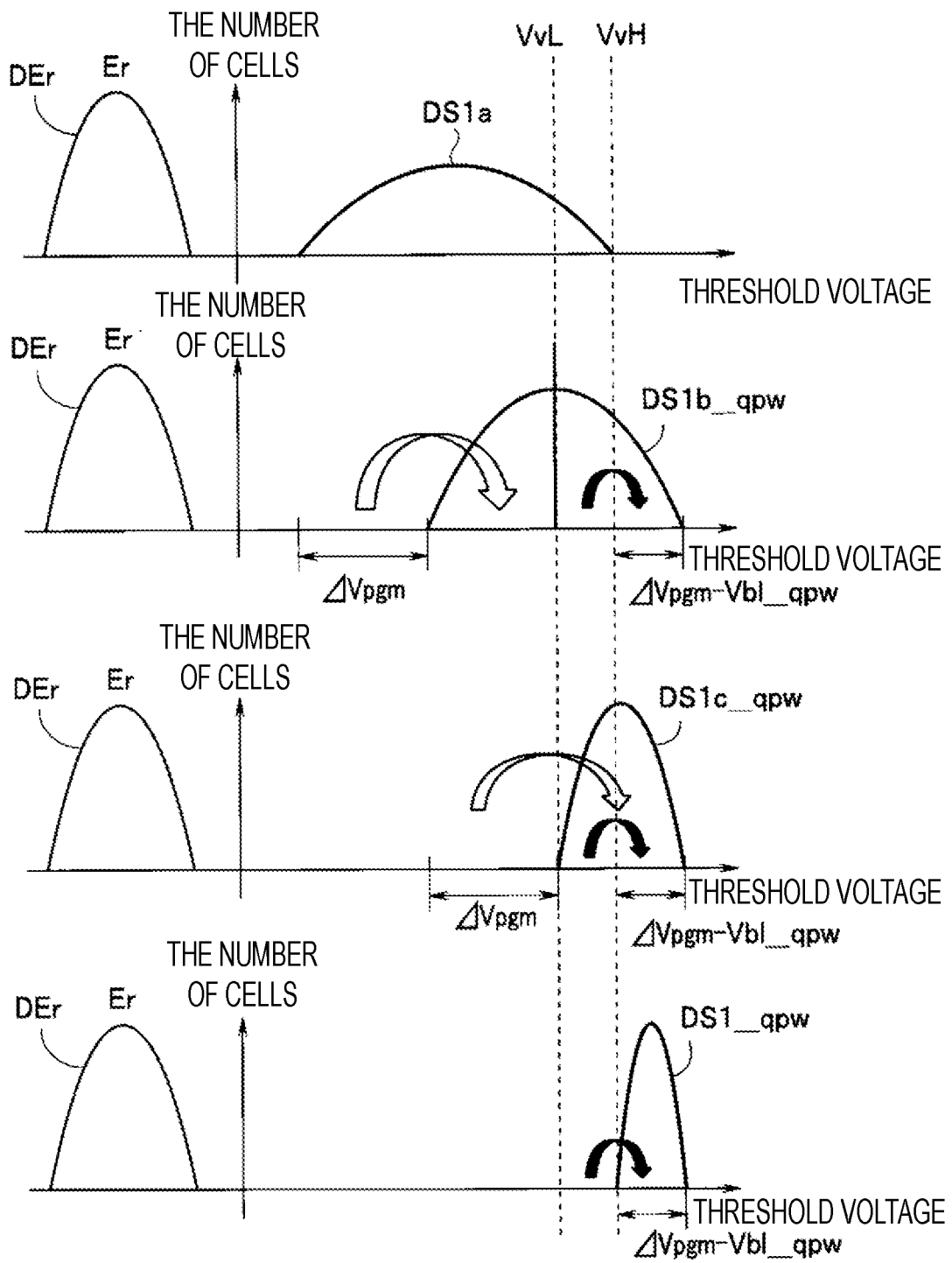
FIG. 10 is conceptual diagram illustrating a QPW operation.

FIGS. 9 and 10 are conceptual diagrams illustrating a change in threshold voltage by the normal program operation and the QPW operation, respectively, with the horizontal axis representing the threshold voltage and the vertical axis representing the number of cells.

In FIGS. 9 and 10, the distribution DEr represents a threshold voltage distribution of the Er state, and the distribution DS1a represents an example of a threshold voltage distribution obtained by a write into each memory cell MT where the target state is the A state, for example, in the first loop. The example of FIG. 9 represents that the verify operation using a verify voltage Vv is performed on each memory cell MT of the target state. In the normal program operation, the bit line voltage is fixed at, e.g., 0 V, and the program voltage is equal to the effective program voltage.

Since the distribution DS1a has not reached the verify voltage Vv, the program voltage is increased by ΔVpgm for each memory cell MT to carry out the second loop.

As a result of the increase in program voltage by ΔVpgm, the threshold voltage of each memory cell MT rises by an amount (indicated by an arrow) corresponding to ΔVpgm, so that a distribution DS1b is obtained. For a memory cell MT in the distribution DS1b having a threshold voltage higher than the verify voltage Vv, write is inhibited, and for a memory cell MT in the distribution DS1b that does not reach the verify voltage Vv, write is performed in the following third loop by also increasing the program voltage by ΔVpgm.

As a result, in the memory cell MT in the distribution DS1b that does not reach the verify voltage Vv, the threshold voltage rises (as indicated by an arrow) by an amount corresponding to ΔVpgm, so that a distribution DS1c is obtained. For a memory cell MT in the distribution DS1c having a threshold voltage higher than the verify voltage Vv, write is inhibited, and for a memory cell MT in the distribution DS1c that does not reach the verify voltage Vv, write is performed in the following fourth loop by also increasing the program voltage by ΔVpgm. As a result, in the memory cell MT in the distribution DS1c that does not reach the verify voltage Vv, the threshold voltage rises (as indicated by an arrow) by an amount corresponding to ΔVpgm, so that a distribution DS1 is obtained. The distribution DS1 indicates that all the memory cells MT have a threshold voltage higher than the verify voltage Vv, and all the memory cells MT set to the target state are subjected to the write inhibition.

In the QPW operation, for example, as illustrated in FIG. 10, the verify operation is performed using a verify voltage VvH corresponding to the verify voltage Vv, and a verify voltage VvL lower than the verify voltage VvH, as verify voltages. Hereinafter, the verify voltage VvH may be referred to as a verify high level, and the verify voltage VvL may be referred to as a verify low level. According to the verify operation, it is determined whether the threshold voltage of a target memory cell MT is lower than the verify low level, or falls between the verify low level and the verify high level, or is higher than the verify high level. Hereinafter, a memory cell of which threshold voltage is determined to be a value between the verify low level and the verify high level will be referred to as a pass write cell. Here, as the QPW operation, an example is illustrated in which two types of voltages, that is, the verify low level and the verify high level, are applied to the word line WL to determine the threshold voltage of the memory cell MT. However, as described later, the verify operation may be performed by changing the operation parameters of the sense amplifier circuit 24 (e.g., shortening the sense time) while keeping the voltage applied to the line WL constant.

Then, when the threshold voltage of the memory cell MT is lower than the verify low level, the program voltage is increased by ΔVpgm as usual, such that when the threshold voltage is higher than the verify high level, write is inhibited, and when the threshold voltage falls between the verify low level and the verify high level, the amount of increase of the effective program voltage is set to be smaller than ΔVpgm.

In the QPW operation, in order to set the amount of increase of the effective program voltage to be smaller than ΔVpgm, the program voltage Vpgm is increased by ΔVpgm, and the bit line voltage is increased from Vbl_L to the QPW voltage Vbl_qpw (Vbl_L<Vbl_qpw). Therefore, the amount of increase of the effective program voltage becomes (ΔVpgm-Vbl_qpw).

In the example of FIG. 10, the verify operation using the verify low level and the verify high level is performed on each memory cell MT of the target state. Assuming that the verify operation is performed in the n-th (n is a natural number) loop in the write sequence, for a memory cell MT which has not reached the verify low level in the distribution DS1a, the effective program voltage is increased by ΔVpgm to perform the (n+1)-th loop. As a result, the threshold voltage of the target memory cell MT is increased by an amount corresponding to ΔVpgm (see arrows in white).

Meanwhile, for a memory cell MT between the verify low level and the verify high level in the distribution DS1a, the effective program voltage is increased by ΔVpgm and the bit line voltage is increased to the QPW voltage Vbl_qpw to perform the (n+1)-th loop. As a result, the effective program voltage of the target memory cell MT is increased by (ΔVpgm-Vbl_qpw), and the threshold voltage thereof is increased by an amount corresponding to the amount of increase of the effective program voltage (see arrows in black). As a result, it is expected that the target memory cell MT is to exceed the verify high level by the (n+1)-th loop. Thus, a threshold voltage distribution DS1b_qpw is obtained by the (n+1)-th loop.

For a memory cell MT in the distribution DS1b_qpw having a threshold voltage higher than the verify high level, write is inhibited, and for a memory cell MT in the distribution DS1b_qpw that does not reach the verify low level, write is performed in the next (n+2)-th loop by also increasing the effective program voltage by ΔVpgm. Further, for a memory cell MT between the verify low level and the verify high level in the distribution DS1b_qpw (the bit line voltage Vbl_L is applied to the connected bit line BL), the program voltage is increased by ΔVpgm and the bit line voltage is increased to the QPW voltage Vbl_qpw to perform the (n+2)-th loop. As a result, the effective program voltage of the target memory cell MT is increased by (ΔVpgm-Vbl_qpw), and the threshold voltage thereof is increased by an amount corresponding to the amount of increase of the effective program voltage (see arrows in black). As a result, it is expected that the target memory cell MT is to exceed the verify high level by the (n+2)-th loop. Thus, a threshold voltage distribution DS1c_qpw is obtained by the (n+2)-th loop.

For a memory cell MT in the distribution DS1c_qpw having a threshold voltage higher than the verified high level, write is inhibited. For a memory cell MT between the verify low level and the verify high level in the distribution DS1c_qpw, in the next (n+3)-th loop, the program voltage is increased by ΔVpgm and the bit line voltage is increased to the QPW voltage Vbl_qpw to perform the (n+3)-th loop. As a result, the effective program voltage of the target memory cell MT is increased by (ΔVpgm-Vbl_qpw), and the threshold voltage thereof is increased by an amount corresponding to the amount of increase of the effective program voltage (see arrows in black). As a result, it is expected that the target memory cell MT is to exceed the verify high level by the (n+3)-th loop. Thus, a threshold voltage distribution DS1_qpw is obtained by the (n+3)-th loop.

As illustrated in FIG. 9, in the normal program operation, each memory cell MT in the area A of the target state has a distribution represented in the threshold voltage distribution DS1, and the width of the target range is ΔVpgm. Meanwhile, in the QPW operation, as illustrated in FIG. 10, each memory cell MT in the area A of the target state has a distribution represented in the threshold voltage distribution DS1_qpw, and the width of the target range is ΔVpgm-Vbl_qpw, which narrows the width of the threshold voltage distribution.

As illustrated in FIG. 10, the width of the threshold voltage distribution during the QPW operation corresponds to the magnitude of change of the threshold voltage, that is, the amount of increase of the effective program voltage. Therefore, by increasing the bit line voltage to reduce the amount of increase of the effective program voltage, the magnitude of change of threshold voltage may be reduced and the width of the threshold voltage distribution can be further reduced.

(Verify Operation)

The verify operation is an operation to verify whether or not the threshold voltage of the selected memory cell MT, which is each memory cell MT related to the selected word line WL, has reached the verify level by the program operation, that is, whether or not desired data is written into the selected memory cell MT. That is, the verify operation is a read operation performed to verify the threshold voltage of the selected memory cell MT, as a part of the write operation.

Figure 11:
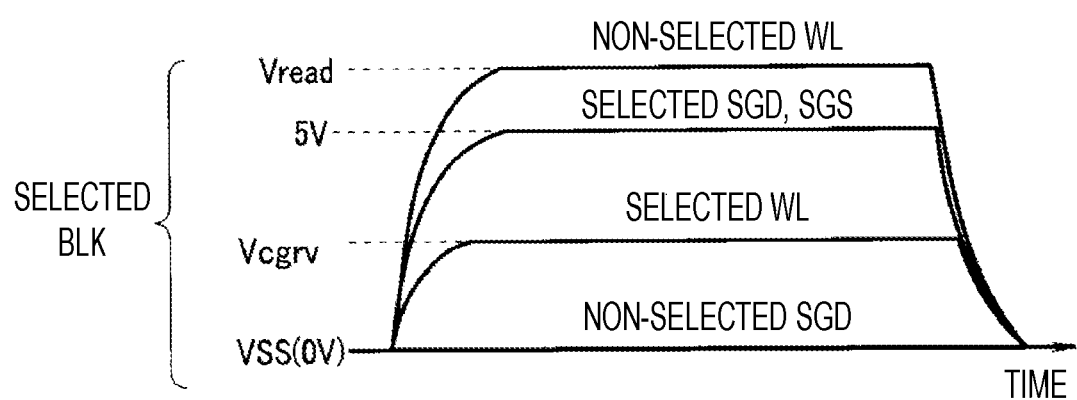
FIG. 11 illustrates voltage changes in various wirings during a verify operation according to the first embodiment.

FIG. 11 illustrates voltage changes in various wirings during the verify operation. The word line driver 25 selects a block BLK and a string unit SU subjected to the program operation and applies, for example, 5 V to the select gate line SGS in the selected block BLK and the select gate line SGD in the selected string unit SU. As a result, in the NAND string in the selected string unit SU, both the select transistor ST1 and the select transistor ST2 are turned on.

Meanwhile, the word line driver 25 applies the voltage Vss to the select gate line SGS in a non-selected block BLK and the select gate line SGD in a non-selected string unit SU in the selected block BLK to turn off the select transistors ST1 and/or ST2. As a result, in the NAND string in the non-selected string unit SU, at least the select transistor ST1 is turned off. Further, in the NAND string in the non-selected block BLK, both the select transistor ST1 and the select transistor ST2 are turned off.

In addition, the word line driver 25 applies a voltage Vcgrv to the selected word line, and applies a voltage Vread to the other non-selected word lines WL. For example, when the program operation for setting the threshold voltage of the memory cell MT to the state A is performed, a voltage AV is used as the voltage Vread in the verify operation. Similarly, when the program operation for setting the threshold voltage of the memory cell MT to the state B is performed, a voltage BV is used as the voltage Vcgrv in the verify operation. The voltage Vread is a voltage for turning on the memory cells MT connected to the non-selected word lines WL regardless of their threshold voltages, and is higher than Vcgrv (GV).

Then, the sense amplifier circuit 24 charges each bit line BL to a voltage Vbl. The voltage Vbl is higher than a voltage Vsl of the source line SL, that is, Vbl>Vsl. As a result, in the NAND string in the selected string unit SU, a current flows (or does not flow) from the bit line BL side to the source line SL side according to the threshold voltage of the memory cell MT connected to the selected word line WL. This makes it possible to verify whether or not the threshold voltage has risen to the desired level.

As described above, the write operation is performed by repeating a loop including the program operation and the verify operation. In the program operation, the program voltage Vpgm is applied to the selected word line WL. In the subsequent verify operation, at least one of the voltages AV to GV is applied corresponding to the threshold voltage to be verified. In each loop, after the program operation is performed, the verify operation may be performed a plurality of times. Alternatively, in each loop, the verify operation may not be performed after the program operation is performed.

(Sense Amplifier Circuit)

Next, descriptions will be made on the sense amplifier circuit 24 which supplies a bit line voltage to each bit line BL and performs an operation of reading and verifying data stored in a memory cell MT.

Figure 12:
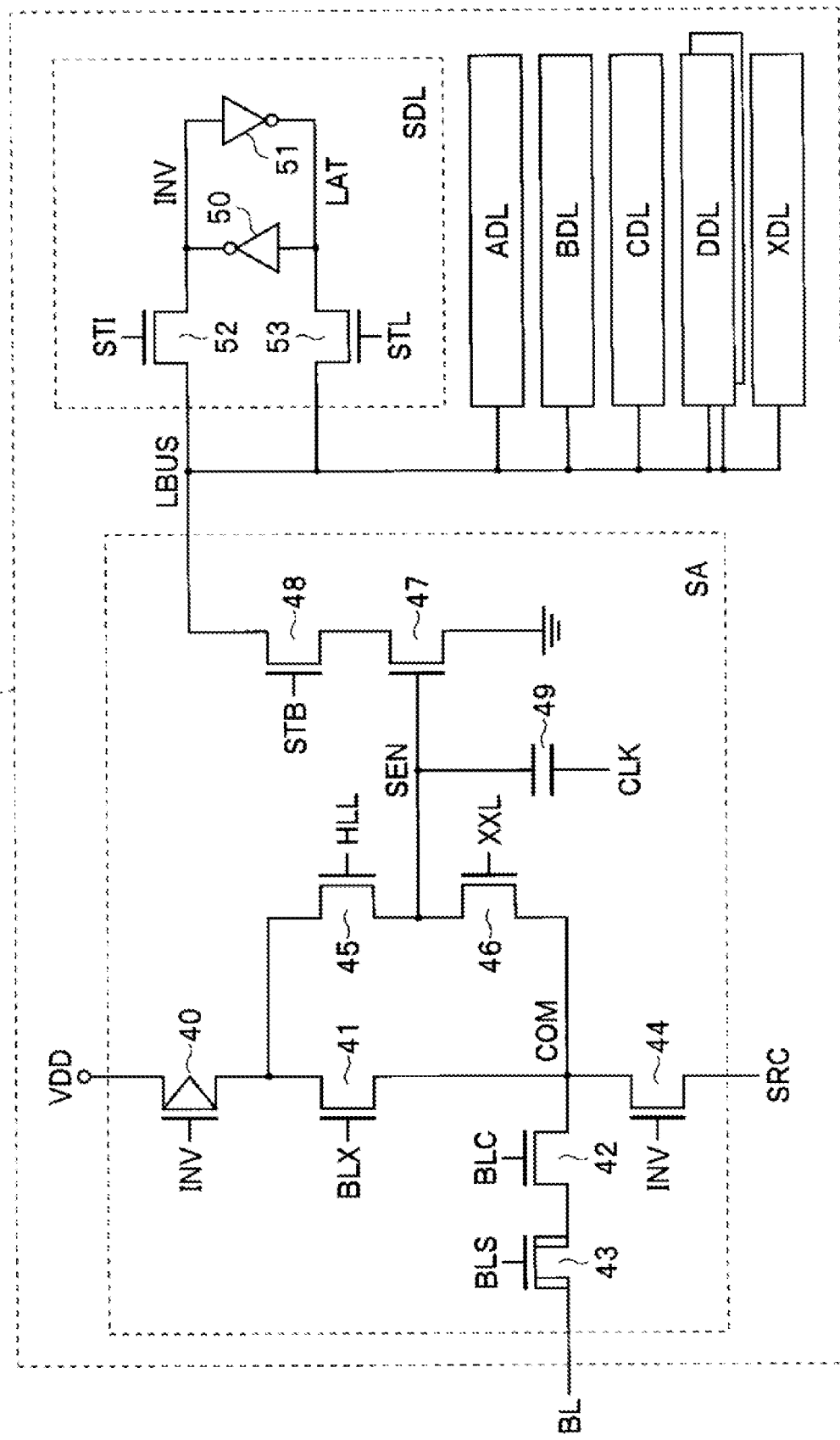
FIG. 12 is a circuit diagram of a sense amplifier circuit of the first embodiment.

FIG. 12 is a circuit of the sense amplifier circuit 24 in FIG. 1. The sense amplifier circuit 24 includes a plurality of sense amplifier units SAU associated with bit lines BL0 to BL(m−1), respectively. FIG. 12 illustrates a detailed circuit configuration of one sense amplifier unit SAU connected to one bit line BL.

As illustrated in FIG. 12, the sense amplifier unit SAU includes a sense amplifier SA and latch circuits SDL, ADL, BDL, CDL, two DDLs, and XDL. The sense amplifier SA and the latch circuits SDL, ADL, BDL, CDL, two DDLs, and XDL are interconnected so as to be able to transmit data between them. The latch circuits SDL, ADL, BDL, CDL, and two DDLs are interconnected by a bus LBUS. The latch circuits SDL, ADL, BDL, CDL, two DDLs, and XDL temporarily store read data, write data, and various data to be described later. The latch circuit XDL is connected to the controller 22 and is used for data input/output between the sense amplifier unit SAU and the controller 22.

The latch circuits ADL, BDL, and CDL store bit data corresponding to the target state at the time of a write operation. The two latch circuits DDL store information on the threshold voltage of the adjacent memory cell MT as described later.

The latch circuit SDL includes, for example, inverters 50 and 51 and n-channel MOS transistors 52 and 53. The input node of the inverter 50 and the output node of the inverter 51 are connected to a node LAT. The input node of the inverter 51 and the output node of the inverter 50 are connected to a node INV. Data of the nodes INV and LAT are stored by the inverters 50 and 51. The write data from the controller 22 is supplied to the node LAT. The data stored at the node INV is the inversion of the data stored at the node LAT.

One end of the drain-source path of the transistor 52 is connected to the node INV, and the other end is connected to the bus LBUS. Further, one end of the drain-source path of the transistor 53 is connected to the node LAT, and the other end is connected to the bus LBUS. A control signal STL is input to the gate of the transistor 53, and a control signal STI is input to the gate of the transistor 52.

In addition, since the latch circuits ADL, BDL, CDL, two DDLs, and XDL have the same configuration as the latch circuit SDL, descriptions thereof will be omitted. In addition, various control signals supplied to the sense amplifier unit SAU are provided from the controller 22.

The sense amplifier SA includes, for example, a p-channel MOS transistor 40, n-channel MOS transistors 41 to 48, and a capacitor 49.

In the read operation, the sense amplifier SA senses the data read into the corresponding bit line BL and determines whether the read data is "0" or "1." In addition, in the program operation, the sense amplifier SA sets the corresponding bit line BL to a voltage value corresponding to the data "0" and "1" to be written.

In the sense amplifier SA, the transistors 40 to 44 are involved in the program operation. The source-drain path of the transistor 40 and the drain-source path of the transistor 41 are connected in series between a power supply line for supplying an internal power supply voltage VDD and a node COM. In addition, the drain-source path of the transistor 44 is connected between the node COM and a node SRC for supplying a ground voltage Vss. In addition, the drain-source path of the transistor 42 and the drain-source path of the transistor 43 are connected in series between the node COM and the bit line BL.

The gates of the transistors 40 and 44 are connected to the node INV. Therefore, when the node LAT is at a low level (hereinafter, referred to as "L") corresponding to the "0" data, the node INV is maintained at a high level (hereinafter, referred to as "H"), the transistor 40 is turned off, and the transistor 44 is turned on. To the contrary, when the node LAT is at "H" corresponding to the "1" data, the node INV is maintained at L," the transistor 40 is turned on, and the transistor 44 is turned off.

In the program operation, control signals HLL and XXL supplied to the gates of the transistors 45 and 46, respectively, are at "L," and the transistors 45 and 46 are turned off. A control signal supplied to the transistor 41 is at "H," and the transistor 41 is turned on. In addition, in the normal program operation, the transistors 42 and 43 are turned on by control signals BLC and BLS.

Therefore, when the "0" data is stored at the node LAT, the transistor 40 is turned off and the transistor 44 is turned on to supply the bit line voltage Vbl_L such as the voltage Vss (e.g., 0 V) from the node SRC to the bit line BL. In addition, when the "1" data is stored at the node LAT, the transistor 40 is turned on and the transistor 44 is turned off to supply the bit line voltage Vbl_H (e.g., 2.5 V) to the bit line BL according to the control signals BLC and BLS applied to the transistors 42 and 43.

In addition, in the present embodiment, in the QPW operation, for a sense amplifier unit SAU connected to a bit line BL corresponding to a pass write cell, the node INV of the latch circuit SDL is set to "H." As a result, the transistor 40 is turned off. Further, the transistor is also turned off by a control signal BLX. In this state, by appropriately setting the control signal BLC and the control signal BLS, a voltage at the time of QPW is supplied to the bit line BL by the transistors 42 and 43.

In the present embodiment, the controller 22 changes the voltage at the time of QPW by controlling the settings of the control signals BLC and BLS.

All the transistors 40 to 48 and the capacitor 49 of the sense amplifier SA are involved in the verify operation. The drain-source path of the transistor 45 and the drain-source path of the transistor 46 are connected in series between the drain of the transistor 40 and the node COM. In addition, the drain-source path of the transistor 48 and the drain-source path of the transistor 47 are connected in series between the bus LBUS and a reference voltage point. The source of the transistor 45 and the drain of the transistor 46 are connected to a sense node SEN, and the sense node SEN is connected to the gate of the transistor 47. The control signals HLL and XXL, the voltage of the sense node SEN, and a control signal STB are applied to the gates of the transistors 45 to 48, respectively. A clock CLK is applied to the sense node SEN via the capacitor 49.

Figure 13:
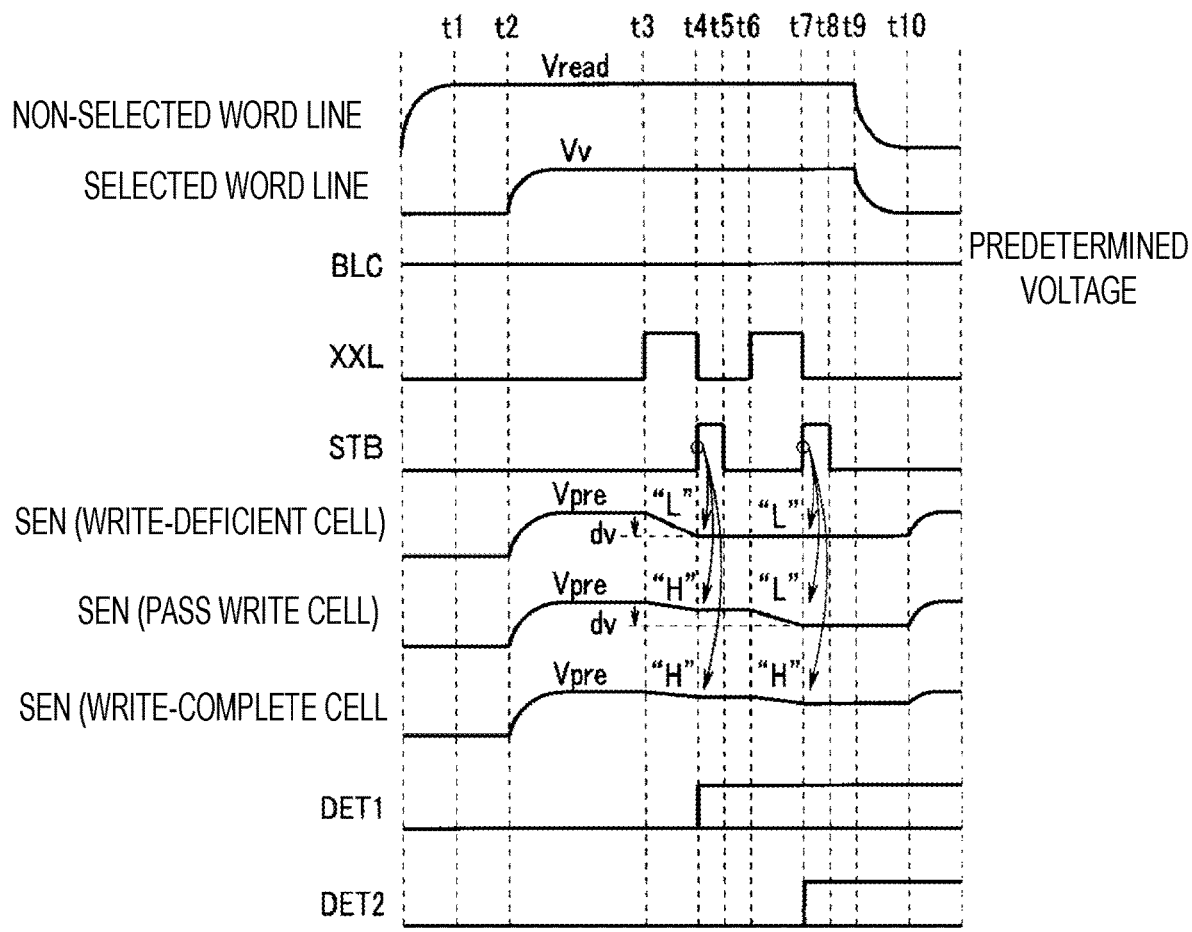
FIG. 13 is a timing diagram illustrating operation waveforms of the sense amplifier circuit of the first embodiment.

Next, the verify operation will be described with reference to FIG. 13. FIG. 13 is a view illustrating an operation waveform of the sense amplifier circuit 24 of FIG. 12.

First, the word line driver 25 applies a verify voltage Vv corresponding to the target state to a selected word line, and applies a voltage Vread (e.g., 5 V to 7 V) higher than the verify voltage Vv to a non-selected word lines.

In the verify operation, the controller 22 first sets the node INV to "L" to turn on the transistor 40. In addition, the bit line BL is fixed at a constant voltage (e.g., 0.5 V) by turning on the transistor 41 by the control signal BLX and setting the control signal BLC and the control signal BLS to a predetermined voltage. Further, by setting the control signal HLL to a predetermined voltage, the sense node SEN is charged to a predetermined pre-charge voltage Vpre higher than the voltage of the bit line BL. In this state, when the control signal XXL is set to "H" (t3), a current flows from the sense node SEN to the bit line BL via the transistors 46, 42, and 43, and the voltage of the sense node SEN gradually decreases.

The voltage of the sense node SEN is changed in accordance with the state of the threshold voltage of the selected memory cell to be verified. That is, when the threshold voltage of the selected memory cell is lower than the verify voltage Vv, the selected memory cell MT is turned on, a large cell current flows in the selected memory cell MT, and a speed at which the voltage of the sense node SEN decreases is increased. In addition, when the threshold voltage of the selected memory cell MT is higher than the verify voltage Vv, the selected memory cell MT is turned off, a small cell current flows in the selected memory cell MT or no cell current flows in the selected memory cell MT, and a speed at which the voltage of the sense node SEN decreases is decreased.

Therefore, at first time t4 when a first period has elapsed from discharge start time t3 at which the sense node SEN starts to be discharged, that is, at a time when the first period elapses after the control signal XXL is set to "H," when the control signal XXL is set to "L" and the control signal STB is set to "H" to turn on the transistor 48, the transistor 47 is turned on/off depending on whether the voltage of the sense node SEN is "L" or "H."

When the selected memory cell MT is a write-deficient cell, since its threshold voltage is lower than the verify voltage Vv and a difference between the two is large, the selected memory cell MT is completely turned on and a large cell current flows in the selected memory cell MT. Therefore, the voltage of the sense node SEN rapidly decreases, and a voltage drop reaches dV before time t4. At time t4, the sense node SEN is at "L," and the transistor 47 is turned off so that no current flows from the bus LBUS to the reference voltage point.

In addition, when the selected memory cell MT is a pass write cell, since its threshold voltage is lower than the verify voltage Vv and a difference between the two is small, a small cell current flows in the selected memory cell MT. Therefore, the voltage of sense node SEN smoothly decreases, and a voltage drop does not reach dV before time t4. At time t4, the sense node SEN remains at a voltage corresponding to "H." Therefore, the transistor 47 is turned on to allow a current to flow from the bus LBUS to the reference voltage point.

In addition, when the selected memory cell MT is a write-complete cell, since its threshold voltage is higher than the verify voltage Vv, the selected memory cell MT is turned off, and a very small cell current flows in the selected memory MT cell or no cell current flows in the selected memory cell MT. Therefore, the voltage of the sense node SEN decreases very slowly, and a voltage drop does not reach dV before time t4. Even at time t4, the sense node SEN remains at "H." Therefore, the transistor 47 is turned on to cause a current to flow from the bus LBUS to the reference voltage point.

Figure 15:
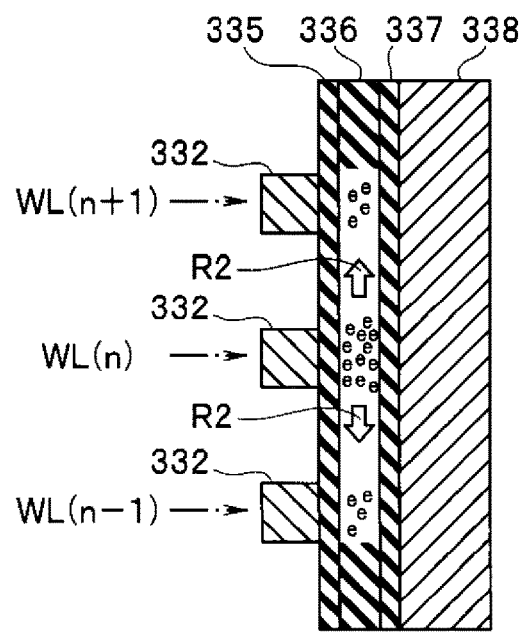

In this way, first, it is possible to sort out write-deficient cells. In FIG. 15, DET1 represents a result of detection of the level of the sense node SEN obtained according to whether or not a current flows in the bus LBUS at first time t4, that is, a result of detection on whether or not the threshold voltage exceeds the verify low level.

Thereafter, at t5 in FIG. 13, the control signal STB is set to a low level to turn off the transistor 48. Subsequently, at t6, the control signal XXL is set to "H" again. Next, at second time t7 when a second period (t6 to t7) elapses in addition to the first period (t3 to t4) in which the sense node SEN is discharged in the previous step, the control signal XXL is set to "L" and the control signal STB is set to "H" to turn on the transistor 48. As a result, the transistor 47 is turned on/off depending on whether the voltage of the sense node SEN is "L" or "H" at second time t7.

For example, when the selected memory cell MT is a write-deficient cell, since the voltage of the sense node SEN rapidly decreases and a voltage drop already reaches dV before time t4, the sense node SEN is at "L" at time t7. Therefore, the transistor 47 is turned off to block any current from flowing from the bus LBUS to the reference voltage point.

In addition, when the selected memory cell MT is a pass write cell, since its threshold voltage is lower than the verify voltage Vv and a difference between the threshold voltage and the verify voltage is small, a small cell current flows in the selected memory cell MT. Therefore, the voltage of sense node SEN decreases by a sufficient amount, such that a voltage drop reaches dV before time t7. At time t7, the sense node SEN is at "L." Therefore, the transistor 47 is turned off to block any current from flowing from the bus LBUS to the reference voltage point.

In addition, when the selected memory cell MT is a write-complete cell, since its threshold voltage is higher than the verify voltage Vv, a very small cell current flows in the selected memory cell MT or no cell current flows in the selected memory cell MT. Therefore, the voltage of the sense node SEN decreases very slowly, and a voltage drop does not reach dV before time t7. At time t7, the sense node SEN remains at "H." Therefore, the transistor 47 is turned on to cause a current to flow from the bus LBUS to the reference voltage point.

In this way, it is possible to sort out pass write cells and write-complete cells. In FIG. 13, DET2 represents a result of detection of the level of the sense node SEN obtained according to whether or not a current flows in the bus LBUS at second time t7, that is, a result of detection on whether the threshold voltage lies between the verify low level and the verify high level or exceeds the verify high level.

As illustrated in FIG. 13, for example, when both DET1 and DET2 are "L," the selected memory cell MT is recognized as a write-deficient cell. When DET1 is "H" and DET2 is "L," the selected memory cell MT is recognized as a pass write cell. When both DET1 and DET2 are "H," the selected memory cell MT is recognized as a write-complete cell.

The operation of the sense amplifier SA described above is merely illustrative on one method to identify a pass write cell. For example, in order to detect whether or not the threshold voltage of the selected memory cell MT exceeds the verify high level and the verify low level, for example, by continuously applying the verify voltage Vv corresponding to the target state and a voltage slightly lower than the verify voltage Vv to the selected word line by the word line driver 25, a current flowing in the selected memory cell MT may be detected by the sense amplifier SA in each verify voltage application period.

The controller 22 determines which one of the write-deficient cell, the pass write cell and the write-complete cell is the selected memory cell, and controls the sense amplifier circuit 24 based on a result of the determination to set a bit line voltage. In this case, in the pass write program operation, the controller 22 changes a voltage at the time of QPW operation according to the level, the loop and the like of the write target memory cell MT.

(Influence of Data Retention Time on Threshold Voltage Distribution)

After the completion of data writing into the selected memory cell MT, the threshold voltage may fluctuate over time while storing the written data. For example, during data writing into the selected memory cell MT, when the amount of charge injection into the charge storage film 336 is large and the amount of charges stored in the charge storage film 336 of a memory cell adjacent to the selected memory cell MT (hereinafter, referred to as an "adjacent memory cell" or "memory cell connected to an adjacent word line") is small, there is a possibility that the threshold voltage of the selected memory cell MT decreases after the completion of the write. In addition, for example, during data writing into the selected memory cell MT, when the amount of charge injection into the charge storage film 336 is small and the amount of charges stored in the charge storage film 336 of the adjacent memory cell MT is large, there is a possibility that the threshold voltage of the selected memory cell MT increases after the completion of the write.

In other words, when the threshold voltage of the selected memory cell MT is high and the threshold voltage of the adjacent memory cell MT is low, the threshold voltage of the selected memory cell MT may decrease after data writing into the selected memory cell MT. Similarly, when the threshold voltage of the selected memory cell MT is low and the threshold voltage of the adjacent memory cell MT is high, the threshold voltage of the selected memory cell MT may increase after data writing into the selected memory cell MT.

In the following description, a memory cell having a large charge injection amount, i.e., a high threshold voltage, will be referred to as a high level memory cell, and a memory cell having a low charge injection amount, i.e., a low threshold voltage, will be referred to as a low level memory cell.

Figure 14:
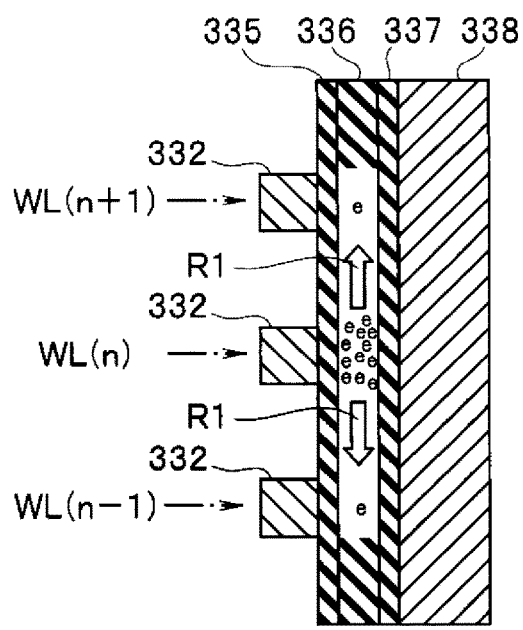
FIGS. 14-15 are conceptual diagrams illustrating movement of electrons in a charge storage film.

FIGS. 14 and 15 are conceptual diagrams illustrating movement of electrons in the charge storage film 336.

When the threshold voltage of the target state of the selected memory cell MT of the selected word line WL(n) is high, many charges (here, electrons "e") are stored in the charge storage film 336 of the memory cell MT corresponding to the selected word line WL(n).

However, when the threshold voltage of one or two adjacent memory cells MT adjacent to the high level memory cell MT in the same channel as the high level memory cell MT of the word line WL (n) is lower than the threshold voltage of the high level memory cell MT, charges move from the high level memory cell MT to the adjacent memory cell MT via the charge storage film 336.

FIG. 14 illustrates a case where the selected memory cell MT is a high level memory cell and the adjacent memory cell MT is a low level memory cell. In this case, the charges of the charge storage film 336 of the high level memory cell MT move to the charge storage film 336 of the adjacent memory cell MT. As illustrated in FIG. 14, the charges of the charge storage film 336 under the gate of the selected word line WL(n) flow out to the charge storage film 336 under the gates of the adjacent word lines WL(n+1) and WL(n−1).

FIG. 15 illustrates a case where the charge amount of the charge storage film 336 of the adjacent memory cell MT is larger than the charge amount of the charge storage film 336 of the adjacent memory cell MT of FIG. 14. That is, FIG. 15 illustrates a case where the threshold voltage of the adjacent memory cell MT is higher than that in the case of FIG. 14.

The amount of charge outflow from the high level memory cell MT in FIG. 15 is smaller than the amount of charge outflow in the case of FIG. 14. In other words, the amount of charge outflow from the high level memory cell MT in FIG. 14 is larger than the amount of charge outflow in the case of FIG. 15. As illustrated, the length of an arrow R1 in FIG. 14 is longer than the length of an arrow R2 in FIG. 15. This indicates that the amount of charge outflow from the high level memory cell MT in FIG. 14 is larger than the amount of charge outflow in the case of FIG. 15.

In a memory cell MT having a three-dimensional structure in which each memory cell MT stores multiple values, as a result of the movement of charges occurs with the elapse of time after data writing, some of adjacent threshold voltage distributions may overlap to reduce a margin in data read.

Figure 16:
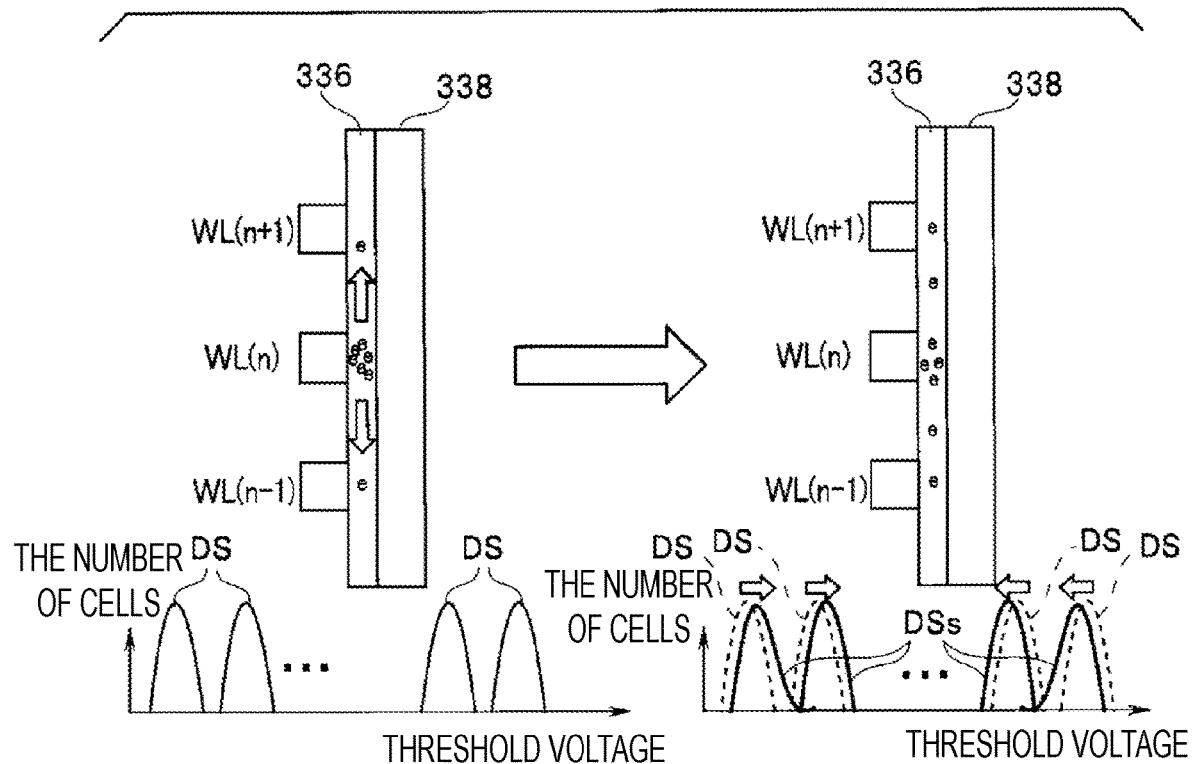
FIG. 16 is a conceptual diagram illustrating influence of data retention time on a threshold voltage distribution.

FIG. 16 is a conceptual diagram illustrating the influence of data retention time on the threshold voltage distribution. In addition, FIG. 16 omits the block insulating film 335 and the gate insulating film 337. The left side of FIG. 16 represents a state where a large amount of charges corresponding to the high target state are stored in the charge storage film 336 of the memory cell MT corresponding to the word line WL(n). The charge amount of the selected memory cell MT corresponds to a threshold voltage distribution according to the target state. Each threshold voltage distribution DS on the left side of FIG. 16 indicates a threshold voltage distribution according to the target state.

Each threshold voltage distribution shifts from each threshold voltage distribution DS indicated by a dotted line on the right side of FIG. 16 to a threshold voltage distribution DSs indicated by a solid line as time elapses after the completion of data write. The high level memory cell MT shifts to the low level side, and the low level memory cell MT shifts to the high level side. As a result, parts of the threshold voltage distributions DSs overlap with each other, and erroneous reading of data occurs when the read voltage set based on the threshold voltage distribution corresponding to each target state is used.

(Countermeasures against Threshold Voltage Distribution Fluctuation)

In the present embodiment, the threshold voltage of the adjacent memory cell MT is checked before the data is written into the selected memory cell MT. Then, according to a difference between the data of the adjacent memory cell MT and the target state of the selected memory cell MT, the amount of charges injected into the selected memory cell MT is changed.

For example, when the threshold voltage of the adjacent memory cell MT is lower than that of the target state of the selected memory cell MT, the amount of charges injected into the selected memory cell MT is increased. In addition, when the threshold voltage of the adjacent memory cell MT is higher than that of the target state of the selected memory cell MT, the amount of charges injected into the selected memory cell MT is decreased.

Here, the amount of charges injected into the selected memory cell MT is changed according to the target state of the selected memory cell MT and the state of the threshold voltage of the adjacent memory cell MT. The amount of charges injected into the selected memory cell MT is increased when the threshold voltage of the adjacent memory cell MT is equal to or higher than a predetermined threshold voltage and the target state of the selected memory cell MT is lower than the predetermined threshold voltage. The amount of charges injected into the selected memory cell MT is decreased, when the threshold voltage of the adjacent memory cell MT is lower than the predetermined threshold voltage and the target state of the selected memory cell MT is equal to or higher than the predetermined threshold voltage. The injection amount of charges is changed by increasing/decreasing the QPW voltage Vbl_qpw in the QPW operation.

Figure 17:
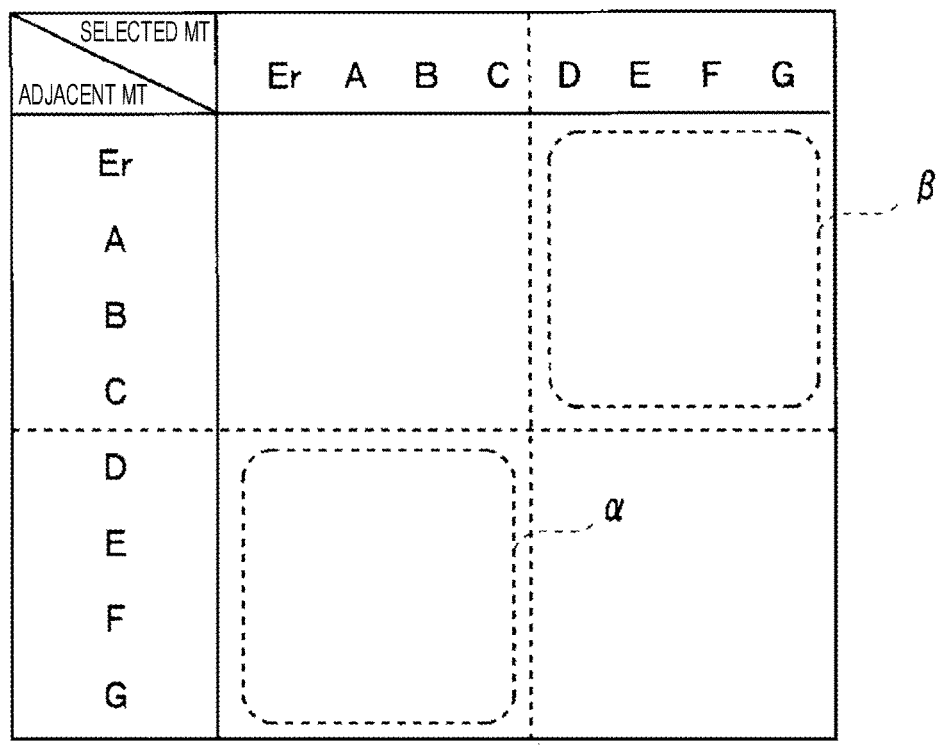
FIG. 17 illustrates the criteria for determining an increase/decrease of a QPW voltage during the QPW operation according to the first embodiment.

FIG. 17 illustrates the criteria for determining an increase/decrease of the QPW voltage Vbl_qpw during the QPW operation. The horizontal axis indicates the target state of the selected memory cell MT, and the vertical axis indicates the threshold voltage state of the adjacent memory cell MT.

When the target state of the selected memory cell MT is any of Er to C and both of the threshold voltages of two adjacent memory cells MT are in any of D to G states, the amount of charges in the selected memory cell MT increases as time elapses. This case corresponds to an area "a" in FIG. 17.

In addition, when the target state of each selected memory cell MT of the selected word line WL(n) is any of D to G and both of the threshold voltages of two adjacent memory cells MT are any of Er to C states, the amount of charges in the selected memory cell MT decreases as time elapses. This case corresponds to the state of an area "0" in FIG. 17.

When performing the QPW operation during data writing into the selected memory cell MT, the controller 22 determines whether the target state of the selected memory cell MT and the threshold voltage of the adjacent memory cell MT are in the area "a" or the area "0" in FIG. 17. The controller 22 determines whether or not the increase/decrease of the QPW voltage Vbl_qpw is necessary based on the determination result.

Here, the range of the target state of the selected memory cell MT is set using the state D as a reference state, and the threshold voltage range of the adjacent memory cell MT is also set using the state D as the reference state. However, the reference state for either range may be some other state, and further, the range of the target state and the range of the threshold voltage state of the adjacent memory cell MT may be different from each other.

Figure 18:
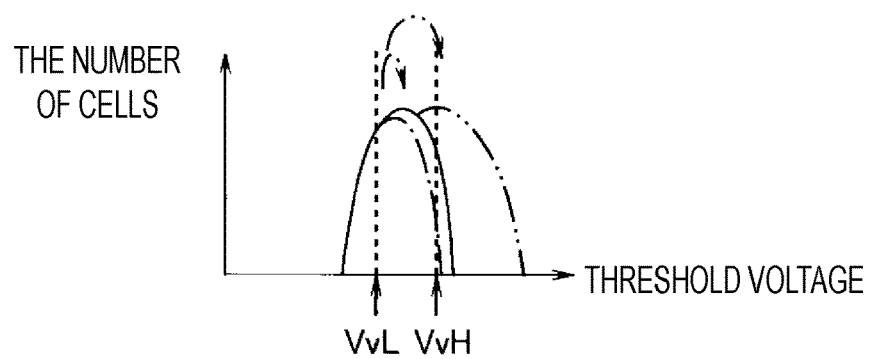
FIG. 18 illustrates a change in threshold voltage distribution according to the increase/decrease of a QPW voltage during the QPW operation according to the first embodiment.

FIG. 18 illustrates a change in threshold voltage distribution according to the increase/decrease of the QPW voltage Vbl_qpw during the QPW operation.

The QPW operation is performed when it is determined that the threshold voltage of the memory cell MT is between the verify voltage VvH of the verify high level and the verify voltage VvL of the verify low level. When the target state of the selected memory cell MT and the threshold voltage state of the adjacent memory cell MT are in the above-described area "α," the controller 22 increases the QPW voltage Vbl_qpw. As a result, the upper range of the threshold voltage distribution moves to the lower side of the threshold voltage as indicated by a one-dot chain line. When the target state of the selected memory cell MT and the threshold voltage state of the adjacent memory cell MT are in the above-described area "β", the controller 22 decreases the QPW voltage Vbl_qpw. As a result, the upper range of the threshold voltage distribution moves to the higher side of the threshold voltage as indicated by a two-dot chain line.

Figure 19:
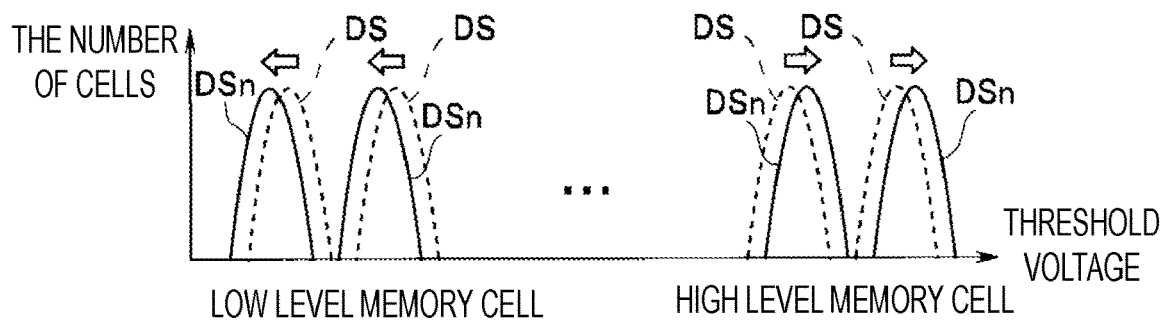
FIG. 19 illustrates a change in threshold voltage distribution in a selected memory cell during the QPW operation according to the first embodiment.

FIG. 19 illustrates a change in threshold voltage distribution in the selected memory cell MT during the QPW operation according to the present embodiment. During data writing into the selected memory cell MT, when the selected memory cell MT is a high level memory cell and the adjacent memory cell MT is a low level memory cell (in the case of area "β"), the QPW voltage Vbl_qpw is decreased such that the threshold voltage of the selected memory cell MT is increased. In addition, during data writing into the selected memory cell MT, when the selected memory cell MT is a low level memory cell and the adjacent memory cell MT is a high level memory cell (in the case of area "α"), the QPW voltage Vbl_qpw is increased such that the threshold value of the selected memory cell MT is decreased.

That is, as illustrated in FIG. 19, the QPW voltage Vbl_qpw is adjusted such that the threshold voltage distribution DS of the high level memory cell MT becomes a threshold voltage distribution DSn shifted to the right, and the threshold voltage distribution DS of the low level memory cell MT becomes a threshold voltage distribution DSn shifted to the left.

As described above, when the threshold voltage of the selected memory cell MT is higher than the threshold voltage of the adjacent memory cell MT, the charges of the selected memory cell MT move to the adjacent memory cell MT with the elapse of time. As a result, the charge amount of the selected memory cell MT decreases, and the threshold voltage distribution of the selected memory cell MT shifts to the lower side of the threshold voltage (to the left in the figure).

Therefore, when the threshold voltage of the selected memory cell MT is higher than the threshold voltage of the adjacent memory cell MT, the shift of the threshold voltage distribution to the left is assumed in advance, and the charge amount during data writing in the selected memory cell MT is increased. In other words, when the threshold voltage range of the target state of the selected memory cell MT is higher than the threshold voltage of the adjacent memory cell MT, the controller 22 decreases the bit line voltage during data writing.

As a result, the threshold voltage distribution DS of the high level memory cell MT shifts to the right to become the threshold voltage distribution DSn. Even when the threshold voltage decreases with the elapse of time, the threshold voltage distribution of the selected memory cell MT and the threshold voltage distribution of the adjacent memory cell MT may not overlap with each other.

Similarly, when the threshold voltage of the selected memory cell MT is lower than the threshold voltage of the adjacent memory cell MT, charges of the adjacent memory cell MT flow into the selected memory cell MT as time elapses. As a result, the charge amount of the selected memory cell MT increases, and the threshold voltage distribution of the selected memory cell MT shifts to the higher side of the threshold voltage (to the right in the figure).

Therefore, when the threshold voltage of the selected memory cell MT is lower than the threshold voltage of the adjacent memory cell MT, the shift in threshold voltage distribution to the right is assumed in advance, and the charge amount during data writing in the selected memory cell MT is decreased. In other words, when the threshold voltage range of the target state of the selected memory cell MT is lower than the threshold voltage of the adjacent memory cell MT, the controller 22 decreases the bit line voltage during data writing.

As a result, the threshold voltage distribution DS of the low level memory cell MT shifts to the left to become the threshold voltage distribution DSn. Even when the threshold voltage increases with the elapse of time, the threshold voltage distribution of the selected memory cell MT and the threshold voltage distribution of the adjacent memory cell MT may not overlap with each other.

The change of the injection amount of charge into the selected memory cell MT as described above is performed by adjusting the QPW voltage Vbl_qpw at the time of QPW. When the charge amount during data writing into the selected memory cell MT is increased, the adjustment is made to lower the bit line voltage during the QPW operation. When the charge amount during data writing in the selected memory cell MT is decreased, the adjustment is made to raise the bit line voltage during the QPW operation.

That is, during data writing into the selected memory cell MT, a change in threshold voltage distribution with the elapse of time is assumed in advance, and the threshold voltage distribution is changed according to the threshold voltage of the adjacent memory cell MT. As a result, even when the threshold voltage distribution changes with the elapse of time, the threshold voltage distribution of the selected memory cell MT and the threshold voltage distribution of the adjacent memory cell MT are less likely to overlap with each other even in part.

Figure 20:
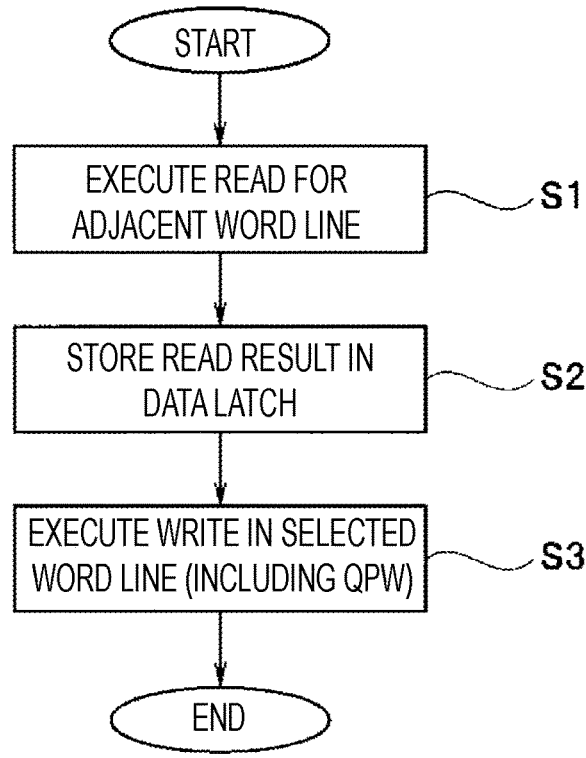
FIG. 20 is a flowchart illustrating a method of data writing by a controller according to the first embodiment.

FIG. 20 is a flowchart illustrating a method of data writing by the controller 22.

When a write command is received, the controller 22 executes a read of the threshold voltage of each adjacent memory cell MT for the adjacent word line adjacent to the selected word line related to the write command (step (hereinafter, abbreviated as S) 1). Here, the threshold voltage of each adjacent memory cell MT is read to determine whether or not the threshold voltage of each adjacent memory cell MT of the adjacent word line is equal to or higher than a predetermined threshold voltage illustrated in FIG. 17, for example, the state D. Therefore, the threshold voltage of each adjacent memory cell MT is read to determine whether or not the threshold voltage of each adjacent memory cell MT is equal to or higher than the verify voltage DV.

The adjacent word lines of the selected word line WL(n) are the upper and lower word lines WL(n−1) and WL(n+1) in FIG. 3. When there is no word line above or below the selected word line WL(n), the read of the threshold voltage is performed only for the adjacent lower or upper word line.

The controller 22 stores the information on the read result (in particular, information on whether the threshold voltage of each adjacent memory cell MT is equal to or higher than the verify voltage DV) in a data latch of the selected word line WL(n) (S2). Here, this data latch includes two latch circuits DDL of each sense amplifier unit SAU of the selected word line WL(n).

For each selected memory cell MT, the state of the threshold voltage of the two adjacent memory cells MT of the upper and lower word lines WL(n−1) and WL(n+1) is stored in the two latch circuits DDL. Therefore, information on threshold voltage states of the two adjacent memory cells MT is stored in the two latch circuits DDL of each sense amplifier unit SAU.

In addition, in a case where a data write is sequentially performed from the word line WL(0) after a data erase, when the end of the string unit SU is the word line WL(7), only the information of the threshold voltage of one adjacent memory cell MT is stored in one of the two latch circuits DDL.

When there is only one latch circuit DDL that stores threshold data of the adjacent memory cells MT, information as to whether or not one of two threshold voltage states of the adjacent memory cells MT of the lower word line is in the area "α" or "β" illustrated in FIG. 17 is stored in the one latch circuit DDL.

In addition, when only one of the two adjacent memory cells MT is in the state (area "α" or "β") as illustrated in FIG. 17, the threshold voltage of a memory cell that is adjacent to the adjacent memory cell MT (hereinafter, referred to as a further adjacent memory cell) may be read. In that case, the threshold data of the further adjacent memory cell is also used to determine which of the states (area "α" or "β") as illustrated in FIG. 17. For example, the threshold voltage of the memory cell MT of the word line WL(n−2) or WL(n−2), which is the further adjacent memory cell, is read, and the data in the latch circuit DDL is updated based on information of the read threshold voltage.

The controller 22 executes the write operation in the selected word line WL(n) (S3). In the write operation, the above-described QPW operation is also performed. As described above, the write operation includes the program operation and the verify operation, and is performed while increasing the effective program voltage by ΔVpgm. When the verify operation using the verify voltage Vv is performed on each memory cell MT in the area of the target state, in a case where the read threshold voltage is a value between the verify low level and the verify high level, the QPW operation is performed by setting the amount of increase of the effective program voltage to a voltage smaller than $\Delta$Vpgm. That is, in the verify operation, when the threshold voltage of the selected memory cell MT is between the verify low level and the verify high level, the above-described QPW operation is performed. Therefore, the QPW operation may not be performed in S3.

As described above, when the write command is received, the controller 22 reads the threshold voltage of the adjacent memory cell MT before executing the program operation on the selected memory cell MT. After that, the data write is executed. During the data write, when the read threshold voltage is a value between the verify low level and the verify high level, the QPW operation is executed to set the amount of increase of the effective program voltage to a voltage smaller than $\Delta$Vpgm.

Figure 21:
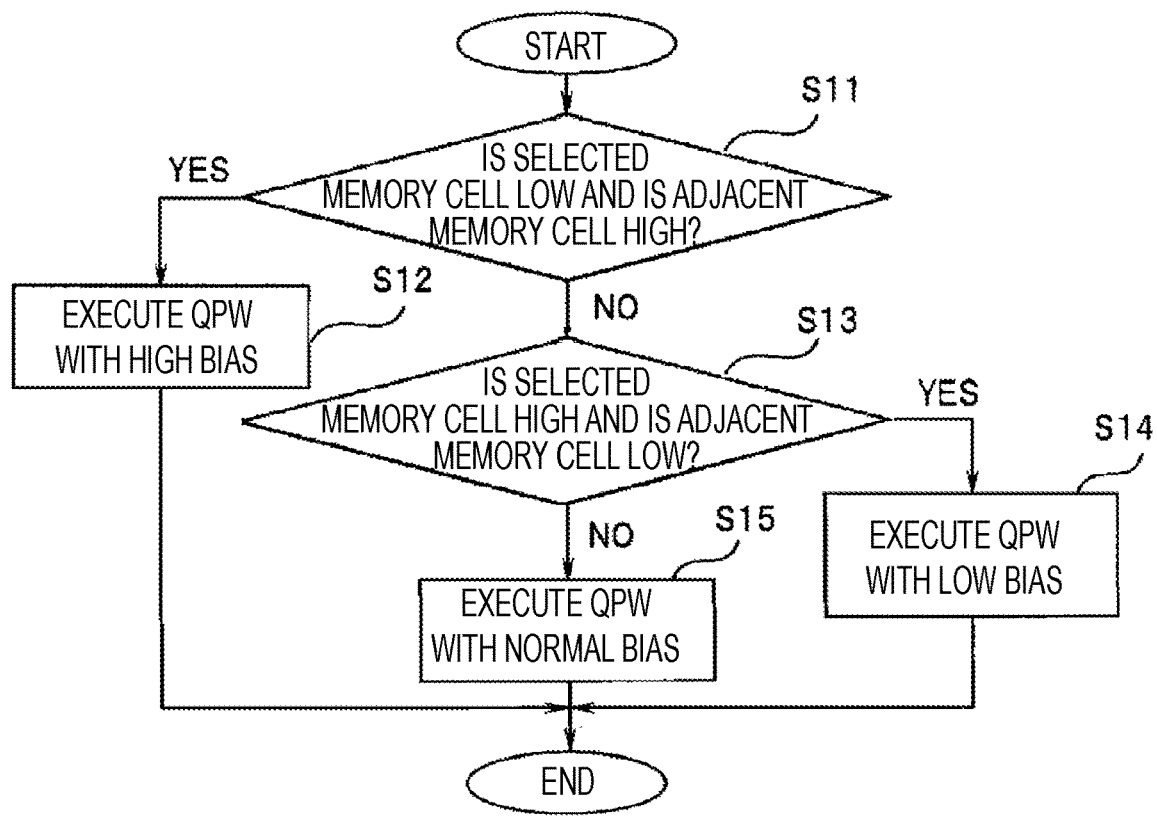
FIG. 21 is a flowchart illustrating steps of a QPW operation that is performed according to the first embodiment.

FIG. 21 is a flowchart illustrating steps of the QPW operation that is executed in S3. When the QPW operation is performed, the QPW voltage Vbl_qpw in the QPW operation is changed according to the read result of the adjacent word line read in S1.

When the QPW operation is executed in S3, the controller 22 determines whether or not the target state of the selected memory cell MT is a low level and the threshold voltage of the adjacent memory cell MT is a high level (S11).

The target state of the selected memory cell MT is stored in the latch circuits ADL, BDL, and CDL which are data latches. The threshold voltage of the adjacent memory cell MT is stored in the two latch circuits DDL by S2. Therefore, based on the values of the latch circuits ADL, BDL, and CDL indicating the target state and the values of the two latch circuits DDL, the controller 22 may determine whether or not the target state of the selected memory cell MT and the threshold value of the adjacent memory cell MT are in the above-described areas "α" and "β."

When it is determined that the target state of the selected memory cell MT is low and the threshold voltage state of the adjacent memory cell MT is high, that is, the target state of the selected memory cell MT and the threshold voltage state of the adjacent memory cell MT are in the area "α" ("YES" in S11), the controller 22 executes the QPW with a bias voltage higher than the QPW voltage Vbl_qpw, which is obtained by adding a voltage Vα of a predetermined increase amount to the QPW voltage Vbl_qpw (S12). As a result, the amount of charges injected into the selected memory cell MT is decreased by the QPW operation of S12.

When it is determined that the target state of the selected memory cell MT is not low or the threshold voltage state of the adjacent memory cell MT is not high ("NO" in S11), the controller 22 determines whether or not the target state of the selected memory cell MT is high and the threshold voltage state of the adjacent memory cell MT is low (S13).

When it is determined that the target state of the selected memory cell MT is high and the threshold voltage state of the adjacent memory cell MT is low, i.e., the target state of the selected memory cell MT and the threshold voltage state of the adjacent memory cell MT are in the area "β" ("YES" in S13), the controller 22 executes the QPW with a bias voltage lower than the QPW voltage Vbl_qpw, which is obtained by subtracting a voltage Vβ of a predetermined increase amount from the QPW voltage Vbl_qpw (S14). As a result, the amount of charges injected into the selected memory cell MT is increased by the QPW operation of S14.

As described above, during the operation of data writing into each memory cell MT, the controller 22, which is a control circuit, controls the sense amplifier circuit 24 to change the bit line voltage of the selected memory cell MT according to the state of a difference between the target state of the selected memory cell MT connected to the selected word line WL to be the target of the data write operation and the threshold voltage state of the adjacent memory cell MT adjacent to the selected memory cell MT.

Specifically, when the target state of the selected memory cell MT is equal to or higher than a predetermined first threshold voltage state (the state D in the above-described example) among the plurality of states and the threshold voltage state of the adjacent memory cell MT is lower than the first threshold voltage state, the controller 22 decreases the bit line voltage during the QPW operation.

In addition, when the target state of the selected memory cell MT is lower than a predetermined second threshold voltage state (the state D in the above example) among the plurality of states and the threshold voltage state of the adjacent memory cell MT is equal to or higher than the second threshold voltage state, the controller 22 increases the bit line voltage during the QPW operation.

When it is determined that the target state of the selected memory cell MT is not high or the threshold voltage state of the adjacent memory cell MT is high ("NO" in S13), the controller 22 executes the QPW operation by applying the normal bias voltage, that is, the QPW voltage Vbl_qpw, to the bit line BL (S15). In addition, when the two adjacent memory cells MT are neither in the area "α" nor in the area "β," the normal QPW operation is executed. The above-described adjustment of the QPW voltage is performed for each bit line BL.

In the example described above, the QPW voltage Vbl_qpw may be changed when both of the two adjacent memory cells MT adjacent to the selected memory cell MT are in the area "α" or in the area "β." Alternatively, the QPW voltage may be changed when only one of the two adjacent memory cells MT is in the area "α" or in the area "β."

Further, in the above-described example, the voltages Vα and Vβ are constant for any selected word line WL. However, these voltages may be different depending on the selected word lines WL0 to WL7. This makes it possible to cope with a case where the amount of movement of charges due to data retention differs due to manufacture deviation of the memory cells MT in the D3 direction illustrated in FIG. 3.

Figure 22:
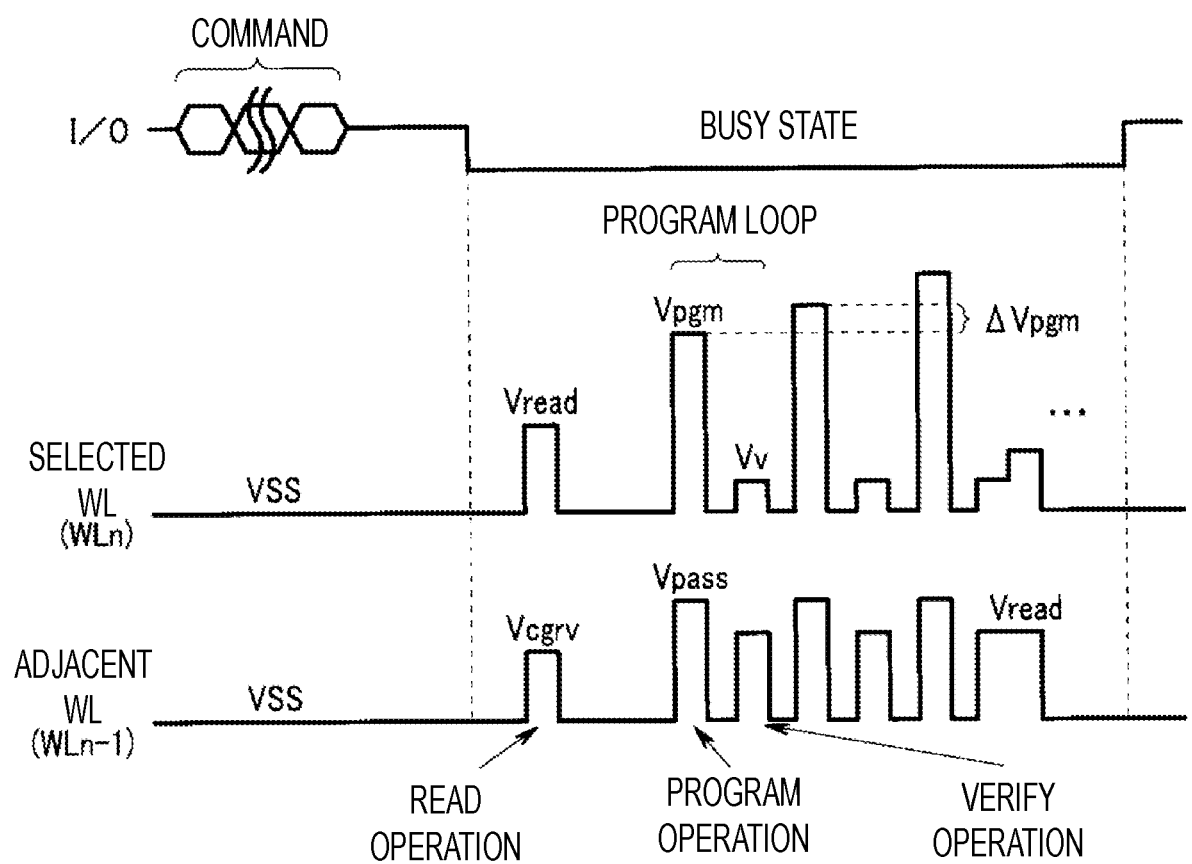
FIG. 22 is a waveform diagram of a selected word line and an adjacent word line during data writing according to the first embodiment.

FIG. 22 is a waveform diagram of a selected word line and an adjacent word line during data writing. When the controller 22 receives a write command via the I/O interface 21, a program loop, that is, a program operation for each selected memory cell MT, is started in the selected word line WL(n). As illustrated in FIG. 22, the write operation is the repetition of a program loop including a program operation of applying a program voltage Vpgm to increase the threshold voltage of the selected memory cell and a verify operation of applying a verify voltage Vv to verify whether or not the threshold voltage of the selected memory cell has sufficiently increased. The number of program loops is, for example, predetermined, and the range of the program loop of application of the program voltage and application of the verify voltage is also preset for each target state.

When reading data of the adjacent word lines WL(n+1) and WL(n−1), a read voltage Vpass_read larger than the threshold voltage GV of the level G is applied to the non-selected word line WL, a voltage Vread is applied to the selected word line WL(n), and a predetermined voltage Vcgrv is applied to the adjacent word line. After reading data of the adjacent word lines WL(n+1) and WL(n−1), data writing is performed.

As described above, in the above-described embodiment, the threshold voltage of the adjacent memory cell MT of the same channel is read before the program operation, and during the QPW operation, a threshold voltage of the selected memory cell is increased or decreased relative to the target state according to the read result. As a result, the decrease or increase in the threshold voltage over time while storing data after the completion of data writing is corrected.

As a result, a threshold voltage distribution of the selected memory cell MT that is robust against the fluctuations in the threshold voltage over time is set so that erroneous reading of data is reduced, and a highly reliable semiconductor memory device may be implemented.

In other words, the effective program voltage is changed by changing the QPW voltage Vbl_qpw during the QPW operation. A positive or negative bias voltage is added to the QPW voltage Vbl_qpw to change the QPW voltage Vbl_qpw. As a result, adjacent threshold voltage distributions are less likely to overlap with each other over time.

As described above, according to the above-described embodiment, it is possible to provide a semiconductor memory device capable of reducing the influence of data retention time on a change of threshold voltage.

Next, modifications of the above-described embodiment will be described.

(First Modification)

In the above-described embodiment, the read of the adjacent word line is performed before the first program loop of the write operation. Alternatively, it may be performed before a program loop that is not the first but is in the middle of the write operation.

For example, in the data coding illustrated in FIG. 5, after a program loop corresponding to data writing up to the target state C is completed, the data of the lower page are all "0," and thus, the latch circuit CDL which is a data latch of the lower page is not used, that is, the latch circuit CDL may be available. The state of the threshold voltage of the adjacent memory cell MT may be stored in the available latch circuit CDL. Further, after data writing up to the target state E is completed, the data of the upper page are all "0," and thus, the latch circuit ADL which is a data latch of the upper page is not used, that is, the latch circuit ADL may be available. The state of the threshold data of the adjacent memory cell MT may be stored in the available latch circuits ADL and CDL.

Figure 23:
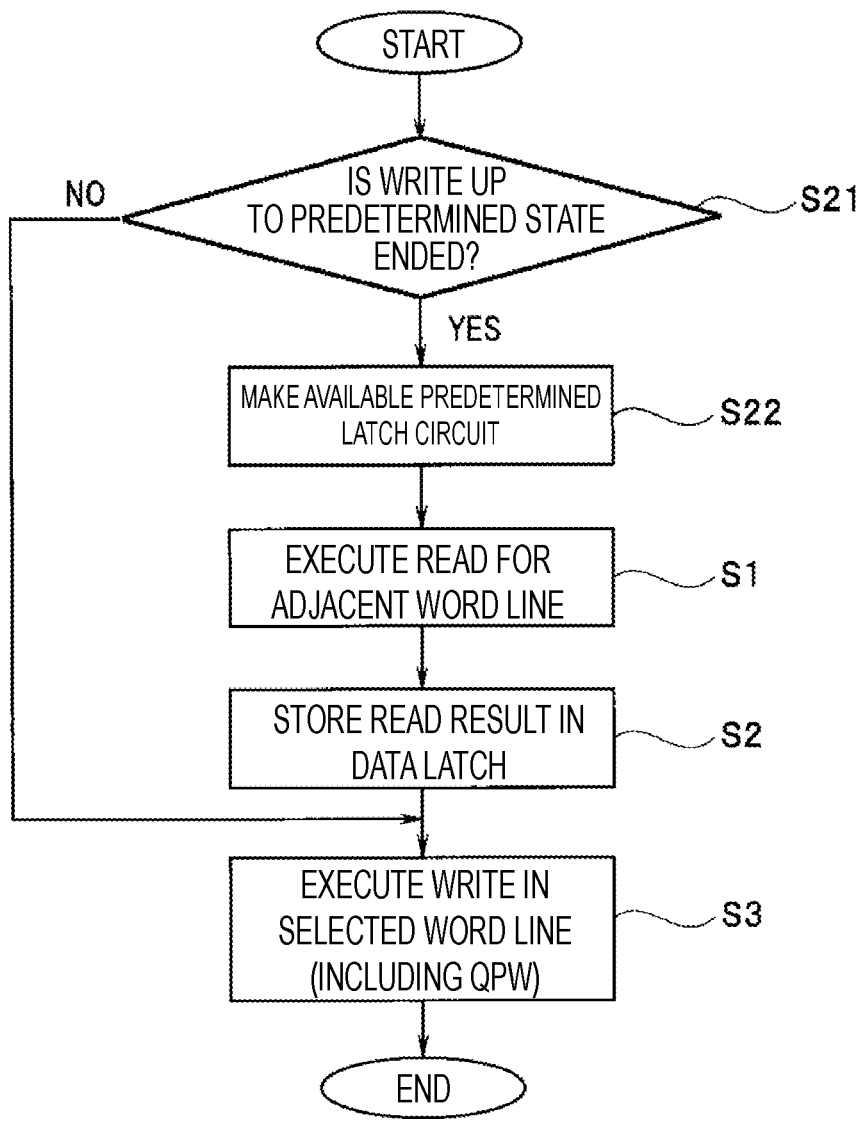
FIG. 23 is a flowchart illustrating a method of data writing by the controller according to a first modification of the first embodiment.

FIG. 23 is a flowchart illustrating a method of data writing by the controller 22 according to a first modification. In FIG. 23, the same processes as those in FIG. 20 will be denoted by the same step reference numerals as used in FIG. 20, and explanation thereof will be omitted. Only differences from FIG. 20 will be described.

The controller 22 determines whether or not the write operation has progressed to a predetermined state (S21). For example, it is determined whether or not the write has been completed up to a program loop corresponding to the state C in FIG. 5.

When it is determined that the write operation is completed up to the predetermined threshold voltage ("YES" in S21), the controller 22 makes available a predetermined latch circuit (S22). For example, in the data coding of FIG. 7, in a program loop corresponding to the state D or higher, all the values of the latch circuit CDL are "0," and thus, the latch circuit CDL may not be used. Thus, the latch circuit CDL is made available.

After that, the steps S1 to S3 described above are performed. The predetermined data latch of S2 is the latch circuit that is made available in S22. When the QPW operation is executed in S3, the same process as that in the above-described embodiment is executed.

In addition, when it is determined that the write operation has not progressed to the predetermined stage ("NO" in S21), the process proceeds to S3. According to the present modification, a latch circuit dedicated to the adjacent memory cell is unnecessary.

In addition, since there is also a data coding pattern other than the data allocation pattern illustrated in FIG. 5, when the latch circuit BDL may also be made available, the state of threshold data of the adjacent memory cell MT may be stored in the latch circuit BDL.

In that case, after the write operation progresses to a threshold voltage at which the two latch circuits BDL and CDL need not be used, the two latch circuits BDL and CDL are made available in S22, and the state of threshold voltage of the adjacent memory cell MT is stored in the two latch circuits BDL and CDL.

According to the present modification, the write operation includes a plurality of program loops. Each program loop includes a program loop consisting of a program operation of applying a program voltage Vpgm to a selected word line WL and a verify operation of applying a verify voltage to the selected word line WL. The plurality of program loops are sequentially executed from a program loop corresponding to a lower threshold voltage state among the plurality of states to a program loop corresponding to a higher threshold voltage state. The controller 22 sequentially reads the threshold voltages of the adjacent memory cells MT from a lower threshold voltage state to a higher threshold voltage state of the plurality of states before a predetermined program loop while executing the write sequence. That is, the controller 22 reads the threshold voltage of the adjacent memory cell when some of the plurality of program loops has finished. Then, the controller 22 stores data of the read threshold voltage of the adjacent memory cell MT in at least one of a plurality of latch circuits ADL, BDL, and CDL which are not used in the subsequent program loop. Therefore, a dedicated latch circuit for the adjacent memory cell MT is unnecessary.

(Second Modification)

In the above-described embodiment, the QPW voltage to the bit line BL is changed based on the area in which the target state of the selected memory cell MT and the threshold voltage state of the adjacent memory cell MT illustrated in FIG. 17 fall. However, the QPW voltage to the bit line BL may be changed based on whether or not the difference between the target state of the selected memory cell MT and the threshold voltage state of the adjacent memory cell MT is equal to or higher than a predetermined number of states.

For example, when the target state of the selected memory cell MT is A and the threshold voltage state of the adjacent memory cell MT is D, the difference is 3. When the difference is 3 or more, the QPW voltage to the bit line BL is changed so as to increase the QPW voltage Vbl_qpw. When the difference is less than 3, the QPW voltage Vbl_qpw is not changed.

In addition, when the target state of the selected memory cell MT is E and the threshold voltage state of the adjacent memory cell MT is A, the level difference is 4. At this time, since the difference is greater than or equal to 3, the QPW voltage to the bit line BL is changed so as to decrease the QPW voltage Vbl_qpw.

As described above, the QPW voltage Vbl_qpw to the bit line BL may be changed based on whether or not the difference between the target state of the selected memory cell MT and the threshold voltage state of the adjacent memory cell MT is equal to or higher than the predetermined number of states.

Further, a plurality of ranges may be provided for determining which range the difference between the target state of the selected memory cell MT and the threshold voltage state of the adjacent memory cell MT belongs to. Then, the QPW voltage to the bit line BL may be changed using an adjustment amount set in advance according to the determined difference range. In this case, latch circuits corresponding to the plurality of ranges are required. Alternatively, the QPW voltage Vbl_qpw may be adjusted according to the difference value.

Second Embodiment

In a second embodiment, the adjustment of the QPW voltage Vbl_qpw of the QPW operation is performed when data writing is performed in two steps.

Since the memory system and the nonvolatile memory according to the second embodiment have the same configurations as the memory system and the nonvolatile memory according to the first embodiment, the same elements as those in the first embodiment will be denoted by the same reference numerals as used in the first embodiment, and explanation thereof will be omitted. Only differences from the first embodiment will be described.

In the two-step write method, after batch erase is executed on the block BLK including the memory cell MT in which data is to be written, data of each target state is roughly written by a first write operation and then is finely written by a second write operation. That is, the write operation in the present embodiment includes the first write operation and the second write operation.

The writing of data into the memory cell array 23 is performed by the controller 22. The controller 22 controls the program voltage Vpgm and the bit line voltage so as to perform the first write operation and the second write operation. In the first write operation, data of a plurality of states having a width larger than each threshold voltage distribution width illustrated in FIG. 5 is written into a plurality of memory cells MT. The second write operation is performed after the first write operation, and data of a plurality of levels A to G having a threshold voltage distribution width illustrated in FIG. 5 is written into a plurality of memory cells MT.

That is, the controller 22 controls the program voltage Vpgm and the bit line voltage so as to perform the first write operation of writing data into the plurality of state having a threshold voltage distribution width wider than the threshold voltage distribution width illustrated in FIG. 5 in the plurality of memory cells MT and the second write operation of writing data into the plurality of states having the threshold voltage distribution width illustrated in FIG. 5 in the plurality of memory cells MT, which is performed after the first write operation.

Figure 24:
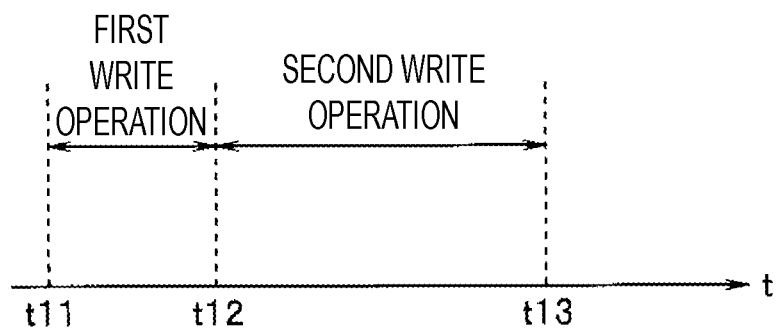
FIG. 24 illustrates a write operation for one word line WL according to a second embodiment.

FIG. 24 illustrates a write operation for one word line WL according to the second embodiment. The first write operation is started at time t11, the second write operation is started after the first write operation is ended at time t12, and the second write operation is ended at time t13. Hereinafter, the first write operation will be referred to as foggy write, and the second write operation will be referred to as fine write.

In order to reduce the adjacent word line interference, assuming that k is any integer from 0 to 7, the foggy write and the fine write are executed in the order of executing the foggy write on the word line WL(k), executing the foggy write on the word line WL(k+1), and then, executing the fine write on the word line WL(k). FIG. 24 schematically illustrates a state in which the second write operation is started after the first write operation is ended at time t12. However, in order to reduce the adjacent word line interference, between a time at which the first write operation for a certain memory cell group MG corresponding to a certain word line WLk is ended and a timing at which the second write operation is started, at least, the first write operation for another memory cell group MG corresponding to the word line WL(k+1) in the same string unit SUj (j is any integer from 0 to 3) is executed.

FIG. 25 illustrates the execution order of the first write operation and the second write operation. For example, as the first to fourth operations, the first write operation for the memory cell group MG corresponding to the word line WL0 is executed. Next, as the fifth to eighth operations, the first write operation for the memory cell group MG corresponding to the word line WL1 is executed.

Next, as the ninth to twelfth operations, the second write operation for the memory cell group MG corresponding to the word line WL0 is executed. The operation is repeated in the same manner for the other word lines. For example, in the operation sequence, the writing of data into the memory cell group MG corresponding to the word line WL0 in the string unit SU0 is completed at a time when the ninth operation is ended.

When the two-step write is performed, an adjacent word line for which the foggy write has not been performed has an unknown threshold voltage, and so, such an adjacent word line is not read in S1 of FIG. 20. Rather, an adjacent word line for which the foggy write has been performed and an adjacent word line for which the fine write has been performed are to be read in S1.

When the foggy write and the fine write are performed for the word lines illustrated in FIG. 25, the foggy write is performed for the word line WL(n), the fine write is performed for the word line WL(n−1), the foggy write is performed for the word line WL(n+1), and then the fine write is performed for the word line WL(n).

In this case, when the fine write is performed for the word line WL(n−1), the threshold voltage of each bit line BL of two adjacent word lines, that is, the word line WL(n) and the word line WL(n−2), is read in S1.

When the foggy write is performed for the word line WL(n+1), the threshold voltage of each bit line BL of only the adjacent word line WL(n) is read in S1.

When the fine write is performed for the word line WL(n), the threshold voltage of each bit line BL of two adjacent word lines, that is, the word line WL(n+1) and the word line WL(n−1), is read in S1.

The QPW operation may be performed only in the fine write or may be performed in both the foggy write and the fine write. Further, the QPW operation may be applied only at the foggy write.

Thus, as described above, according to the above-described second embodiment, it is possible to provide a semiconductor memory device capable of reducing the influence of data retention time on a change in threshold voltage.

Each modification of the first embodiment is also applicable to the second embodiment.

According to the above-described embodiments and modifications, it is possible to provide a semiconductor memory device capable of reducing the influence of the elapse of time on a change in threshold voltage while storing data after the completion of write.

In the above-described embodiments and modifications, the memory cell MT is TLC (Triple-Level Cell), in which 3-bit (8-level) data is stored. However, the above-described embodiments and modifications may be equally applied to other multi-level memories such as MLC (Multi-Level Cell), in which 2-bit (4-level) data is stored, QLC (Quad-Level Cell), in which 4-bit (16-level) data is stored, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells, the plurality of memory cells including first and second memory cells;
a plurality of word lines connected to the gates of the plurality of memory cells, respectively, the plurality of word lines including adjacent first and second word lines, wherein the first word line is connected to the gate of the first memory cell and the second word line is connected to the gate of the second memory cell;
a word line driver configured to apply a voltage to each of the plurality of word lines;
a plurality of bit lines connected to the plurality of memory cells, the plurality of bit lines including a first bit line connected to the first and second memory cells;
a sense amplifier circuit configured to detect data stored in the plurality of memory cells via the plurality of bit lines and apply a bit line voltage to the plurality of bit lines; and
a control circuit configured to control the word line driver and the sense amplifier circuit to execute a write operation,
wherein, during a write operation performed on the first memory cell to increase a threshold voltage of the first memory cell to a target threshold voltage state, the control circuit changes the bit line voltage of the first bit line according to a difference between the target threshold voltage state and a threshold voltage state of the second memory cell.

2. The semiconductor memory device according to claim 1, wherein
when the target threshold voltage state is a low state and the threshold voltage state of the second memory cell is a high state, the control circuit sets the bit line voltage to a higher level than when the target threshold voltage state is a high state and the threshold voltage state of the second memory cell is a high state or when the target threshold voltage state is a low state and the threshold voltage state of the second memory cell is a low state.

3. The semiconductor memory device according to claim 1, wherein
when the target threshold voltage state is a high state and the threshold voltage state of the second memory cell is a low state, the control circuit sets the bit line voltage to a lower level than when the target threshold voltage state is a high state and the threshold voltage state of the second memory cell is a high state or when the target threshold voltage state is a low state and the threshold voltage state of the second memory cell is a low state.

4. The semiconductor memory device according to claim 1, wherein
during the write operation on the first memory cell, the control circuit reads data stored in the second memory cell to determine the threshold voltage state of the second memory cell.

5. The semiconductor memory device according to claim 4, wherein
the write operation includes a plurality of program loops, and
the control circuit reads the data stored in the second memory cell prior to executing any of the program loops.

6. The semiconductor memory device according to claim 4, further comprising:
a plurality of latch circuits configured to latch a plurality of data corresponding to write data of the first memory cell,
wherein the control circuit stores the threshold voltage state of the second memory cell in at least one of the plurality of latch circuits.

7. The semiconductor memory device according to claim 6, wherein
the write operation includes a plurality of program loops, and
the control circuit reads the data stored in the second memory cell after executing some of the program loops.

8. The semiconductor memory device according to claim 1, wherein
the write operation includes a plurality of program loops, each program loop including a programming operation and a verify operation, and the programming operation includes a normal programming operation and a quick pass write programming operation during which a quick pass write voltage is applied to the first bit line, and
during the write operation on the first memory cell, the control circuit changes the quick pass write voltage from a normal level according to the difference between the target threshold voltage state and the threshold voltage state of the second memory cell.

9. The semiconductor memory device according to claim 8, wherein
when the target threshold voltage state is a low state and the threshold voltage state of the second memory cell is a high state, the control circuit increases the quick pass write voltage relative to the normal level.

10. The semiconductor memory device according to claim 8, wherein
when the target threshold voltage state is a high state and the threshold voltage state of the second memory cell is a low state, the control circuit decreases the quick pass write voltage relative to the normal level.

11. The semiconductor memory device according to claim 1, wherein
the write operation includes a foggy write phase and a fine write phase, and the control circuit changes the bit line voltage of the first bit line according to the difference between the target threshold voltage state and the threshold voltage state of the second memory cell while executing the fine write phase of the first memory cell and not while executing the foggy write phase of the first memory cell.

12. The semiconductor memory device according to claim 11, wherein the second word line is below the first word line and the second memory cell has a higher execution priority for writing than the first memory cell.

* * * * *